United States Patent
Ting et al.

(10) Patent No.: US 11,965,822 B2
(45) Date of Patent: Apr. 23, 2024

(54) LIGHT EMITTING APPARATUS, LIGHT EMITTING METHOD, LIGHT DETECTION APPARATUS, SPECTRUM DETECTION METHOD AND LIGHTING CORRECTION METHOD

(71) Applicant: MEGA CRYSTAL BIOTECHNOLOGY SINGAPORE PTE. LTD, Singapore (SG)

(72) Inventors: Yi-Sheng Ting, New Taipei (TW); Yu-Tsung Chen, New Taipei (TW)

(73) Assignee: MEGA CRYSTAL BIOTECHNOLOGY SINGAPORE PTE. LTD, Singapore (SG)

( * ) Notice: Subject to any disclaimer, the term of this patent is extended or adjusted under 35 U.S.C. 154(b) by 191 days.

(21) Appl. No.: 17/761,377

(22) PCT Filed: May 18, 2021

(86) PCT No.: PCT/IB2021/054240
§ 371 (c)(1),
(2) Date: Mar. 17, 2022

(87) PCT Pub. No.: WO2021/255545
PCT Pub. Date: Dec. 23, 2021

(65) Prior Publication Data
US 2022/0373453 A1    Nov. 24, 2022

(30) Foreign Application Priority Data
Jun. 20, 2020 (TW) .................... 109120982

(51) Int. Cl.
*G01N 21/25* (2006.01)
*G01N 21/359* (2014.01)
(Continued)

(52) U.S. Cl.
CPC ......... *G01N 21/255* (2013.01); *G01N 21/359* (2013.01); *G01N 21/39* (2013.01);
(Continued)

(58) Field of Classification Search
CPC .... G01N 21/255; G01N 21/359; G01N 21/39; G01N 2201/0694; G01N 2201/121;
(Continued)

(56) References Cited

U.S. PATENT DOCUMENTS

2012/0112626 A1* 5/2012 Sakuta ............... C09K 11/7718
                                                                  313/501
2015/0085295 A1    3/2015 Yoshioka et al.
(Continued)

FOREIGN PATENT DOCUMENTS

| CN | 101236107 A | 8/2008 |
| CN | 101701854 A | 5/2010 |

(Continued)

OTHER PUBLICATIONS

Office Action with the first search report for the corresponding JP Appln.2022-576109 dated Sep. 5, 2023.
(Continued)

*Primary Examiner* — Md M Rahman
(74) *Attorney, Agent, or Firm* — Muncy, Geissler, Olds & Lowe, P.C.

(57) ABSTRACT

A light emitting apparatus has light emitting units. The light emitting units can be respectively provided with current densities, so that the light emitted by each of the light emitting unit has a light intensity, wherein the current densities are different from each other, or partial of the current densities are different from each other. A number of the light emitting units can be larger than or equal to four, all of the four lighting frequencies of the four light emitting units are different from each other, or partial of the four
(Continued)

lighting frequencies of the four light emitting units are identical to each other, and the light emitting apparatus and the object under test rotate relative to each other. A light emitting method, a spectrum detection method and a lighting correction method are also illustrated for increasing SNR, correcting the light intensity or the spectrum signal.

1 Claim, 28 Drawing Sheets

(51) Int. Cl.
*G01N 21/39* (2006.01)
*H05B 45/18* (2020.01)

(52) U.S. Cl.
CPC ..... *H05B 45/18* (2020.01); *G01N 2201/0694* (2013.01); *G01N 2201/121* (2013.01); *G01N 2201/125* (2013.01)

(58) Field of Classification Search
CPC ..... G01N 2201/125; G01N 2201/0612; G01N 2201/0627; H05B 45/18; H05B 47/11; H05B 45/20; G01J 3/42; G01J 3/10; H01L 25/075; H01L 33/48; H01S 5/40; H01S 5/42
USPC ........................................................ 356/326
See application file for complete search history.

(56) References Cited

U.S. PATENT DOCUMENTS

| | | |
|---|---|---|
| 2015/0282274 A1 | 10/2015 | Uchida et al. |
| 2018/0182992 A1 | 6/2018 | Seo et al. |
| 2021/0080386 A1 | 3/2021 | Ting |

FOREIGN PATENT DOCUMENTS

| | | |
|---|---|---|
| CN | 203981304 U | 12/2014 |
| CN | 205388567 U | 7/2016 |
| CN | 107202782 A | 9/2017 |
| CN | 109932335 A | 6/2019 |
| CN | 110546772 A | 12/2019 |
| CN | 111987079 A | 11/2020 |
| JP | 2000-47697 A | 2/2000 |
| JP | 2005-502895 A | 1/2005 |
| JP | 2006-17689 A | 1/2006 |
| JP | 2008-282936 A | 11/2008 |
| TW | 200818363 A | 4/2008 |
| TW | 201825466 A | 7/2018 |
| TW | 201921715 A | 6/2019 |
| TW | 201921755 A | 6/2019 |
| TW | 201934720 A | 9/2019 |
| TW | 201943113 A | 11/2019 |
| TW | 202013786 A | 4/2020 |
| TW | 202017910 A | 5/2020 |
| WO | 2020-003008 A1 | 1/2020 |

OTHER PUBLICATIONS

Search Report corresponding to TW Application No. 109120982 dated Nov. 5, 2020, pp. 4.

* cited by examiner

LIGHT EMITTING APPARATUS, LIGHT EMITTING METHOD, LIGHT DETECTION APPARATUS, SPECTRUM DETECTION METHOD AND LIGHTING CORRECTION METHOD

TECHNICAL FIELD

The present disclosure relates to a light emitting apparatus, and in particular to a light emitting apparatus, light emitting method, light detection apparatus, spectrum detection method and a lighting correction method, all of which can select a wavelength range, a light emission peak wavelength, a difference between two adjacent light emission peak wavelengths, a full-width at half-maximum (FWHM) range, and a lighting frequency of light emitted by a light emitting diode (LED).

RELATED ART

Spectrometers can be used to measure the transmitted light through the object or the reflected light reflected by the surface of the object, and the conventional spectrometer usually includes a light source and a monochromator, wherein the light source can be a halogen gas-filled tungsten filament lamp (halogen tungsten lamp) to produce light with a continuous spectrum of Vis-near IR (visible light-near infrared light), and the emission spectrum of Vis-near IR is about 320 nm to 2500 nm. Next, the monochromator composed of a prism or a grating selects a monochromatic light of a specific wavelength for the absorption or reflection measurement of the sample (or called object under test), which of course also includes continuous scanning within the set wavelength range to analyze the absorption spectrum or reflection spectrum of the sample. However, as the problems of the tungsten filament lamp mentioned by the issued patent of CN101236107B, due to the high calorific value and high temperature of the tungsten filament lamp, when using the tungsten filament lamp as a light source for organic product testing such as agricultural products, food, pharmaceuticals and petrochemical products, high temperature will cause qualitative changes in organic samples, which seriously affects the test results. The disclosure in the aforementioned the issued patent of CN101236107B is included in the present disclosure.

The issued patent of CN101236107B discloses the light source of the spectrometer can be multiple light emitting diodes (LEDs). Each LED emits light having a monochromatic spectrum in a different wavelength range. In addition to combining the light emitted by the aforementioned multiple LEDs into the light with a continuous spectrum, according to the design, merely the LED corresponding to the wavelength range is turned on when merely the monochromatic light of a certain wavelength range is needed. That is, the multiple LEDs can be turned on at the same time to emit light with a continuous spectrum, and the corresponding LEDs can be sequentially turned on according to the wavelength ranges which are needed to be scanned. However, the issued patent of CN101236107B focuses the light beams emitted by the LEDs on the entrance slit of the monochromator, and thus the problem of the high manufacturing cost and high system complexity of the monochromator cannot be solved. The issued patent of CN205388567U utilizes the assembly of LEDs and fibers to replace monochromator, and further utilizes a full reflection mirror to increase the light path length to enhance the sample detecting efficiency. The disclosure in the aforementioned the issued patent of CN205388567U is included in the present disclosure, and the issued patent of CN109932335A further discloses the similar technology.

Although the aforementioned three patents have improved the problems of conventional spectrometer's light source heating and monochromator cost. However, in the aforementioned three patents, the wavelength resolution (usually greater than 10 nm) of the spectroscopy using the LED array as the light source is lower than the wavelength resolution (usually 1 nm) of the conventional spectrometer using halogen lamps and monochromator. It causes doubts on the accuracy of the aforementioned three patents, since the aforementioned three patents utilize the LED array as the light source to analyze the spectrum of the sample. Another problem of the aforementioned three patents is that the signal-to-noise ratio (SNR or S/N) cannot be improved. The aforementioned three patented utilizes the LED arrays to replace tungsten halogen lamps as light sources, but they have not changed other operation of the light source, so it is obvious that there is no improvement in the SNR decrease caused by the light source end, and the aforementioned three patents cannot further improve SNR. There is also a problem in the aforementioned three patents illustrated as follows. Because the LEDs are arranged in a row or in a predetermined manner to form an LED array on a plane, such arrangement of the LEDs limits that the surface of the object under test must be parallel to the plane to ensure the accuracy of the measurement. However, in fact, the surface of the object under test is usually difficult to keep parallel to the plane. For example, the surface of the object under test is a slightly curved surface; or, for some reason, when the object under test is placed, the surface of the object under test cannot be kept parallel to the plane, resulting in a misjudgment of the surface composition or internal composition of the entire object under test. Even if the surface of the object under test can be guaranteed to be parallel to the plane, when the surface composition or internal composition of the object under test is not uniform in each area of the object under test, a single measurement of the reflection spectrum of the surface of the object under test or the measurement result of the absorption spectrum that the light penetrates the object under test will lead to misjudgment of the surface composition or internal composition of the entire object under test. The aforementioned three patents also do not consider the problem that the light intensity must be corrected due to the heat dissipation of the LEDs.

SUMMARY

The main purpose of the present disclosure is to provide a rotary type light emitting apparatus and a light detection apparatus composed of the light emitting apparatus, wherein the light emitting apparatus comprises a plurality of LEDs that emit light with different wavelength ranges. The analysis result of the sample by using the light detection apparatus of the present disclosure is close to the high resolution result by using the conventional halogen tungsten lamp spectrometer, and at the same time, the signal-to-noise ratio in the spectrum of the sample detection result is improved. Further, with the correction of the light intensity, accurate measurement results of the reflection spectrum of the surface under test or the absorption spectrum that the light penetrates the object under test can be obtained in a single measurement.

To achieve the above objective, a light emitting apparatus at least comprising a plurality of light emitting units is provided. Each of the light emitting units emits light with at least a light emission peak wavelength and at least a wavelength range. The wavelength ranges of the two light emitting units corresponding to the two adjacent light emission peak wavelengths are partially overlapped to form a continuous wavelength range which is wider than each of the wavelength ranges of the light emitting units, or alternatively, the wavelength ranges of the two light emitting units corresponding to the two adjacent light emission peak wavelengths are non-overlapped. The light emitting units are respectively provided with current densities, so that the light emitted by each of the light emitting unit has a light intensity, wherein the current densities are different from each other, or partial of the current densities are different from each other.

In an embodiment of the present disclosure, a difference between the two adjacent light emission peak wavelengths is larger than or equal to 1 nm, a full-width at half-maximum (FWHM) corresponding to one of the at least partial light emission peak wavelengths is larger than 0 nm and less than or equal to 60 nm.

In an embodiment of the present disclosure, the light emitting unit is a light emitting diode (LED), a vertical-cavity surface-emitting laser (VCSEL) or a laser diode (LD).

In an embodiment of the present disclosure, each of the light emitting units discontinuously emits the light with a lighting frequency, and all of the lighting frequencies are identical to or different from each other, or partial of the lighting frequencies are identical to or different from each other.

In an embodiment of the present disclosure, a number of the light emitting units is larger than or equal to four, and all of the four lighting frequencies of the four light emitting units are different from each other, or partial of the four lighting frequencies of the four light emitting units are identical to each other.

In an embodiment of the present disclosure, the lighting frequency is 0.05-50000 times/second.

In an embodiment of the present disclosure, a light emitting unit turned-on time interval of the lighting frequency is 0.00001-10 seconds.

In an embodiment of the present disclosure, a light emitting unit turned-off time interval of the lighting frequency is 0.00001-10 seconds.

In an embodiment of the present disclosure, the difference between the two adjacent light emission peak wavelengths is 1-80 nm.

In an embodiment of the present disclosure, the difference between the two adjacent light emission peak wavelengths is 5-80 nm.

In an embodiment of the present disclosure, the FWHM corresponding to each of the light emission peak wavelengths is 15-50 nm.

In an embodiment of the present disclosure, the FWHM corresponding to each of the light emission peak wavelength is 15-40 nm.

To achieve an objective of the present disclosure, a light detection apparatus at least comprising a light source controller, a light emitting apparatus, a light detector and a computer is provided. The light source controller is electrically connected to the light emitting apparatus, the light detector is electrically connected to the computer, the light detector receives a light beam emitted by the light emitting apparatus, and a propagation path of the light beam between the light emitting apparatus and the light detector forms a light path. The light emitting apparatus at least comprises a plurality of light emitting units, wherein each of the light emitting units emits light with at least a light emission peak wavelength and at least a wavelength range. The wavelength ranges of the two light emitting units corresponding to the two adjacent light emission peak wavelengths are partially overlapped to form a continuous wavelength range which is wider than each of the wavelength ranges of the light emitting units, or alternatively, the wavelength ranges of the two light emitting units corresponding to the two adjacent light emission peak wavelengths are non-overlapped. A difference between the two adjacent light emission peak wavelengths is larger than or equal to 1 nm, a FWHM corresponding to one of the at least partial light emission peak wavelengths is larger than 0 nm and less than or equal to 60 nm. Each of the light emitting units discontinuously emits the light with a lighting frequency, a number of the light emitting units is larger than or equal to four, and all of the four lighting frequencies of the four light emitting units are different from each other, or partial of the four lighting frequencies of the four light emitting units are identical to each other.

In an embodiment of the present disclosure, a mathematical analysis module is installed in the light detector or the computer, the mathematical analysis module is electrically or signally connected to the light detector, or the mathematical analysis module is electrically or signally connected to the computer, the mathematical analysis module is a hardware or software based module, and a signal collected by the light detector is transmitted to the mathematical analysis module. During a light emitting unit turned-on time interval of the lighting frequency, the signal received by the light detector is a composite signal of a background noise and a spectrum signal of an object under test, during a light emitting unit turned-off time interval of the lighting frequency, the signal received by the light detector is the background noise, the spectrum signal of the object under test and the background noise forms a time-domain signal of the object under test, and the mathematical analysis module comprises a time-domain/frequency-domain transformation unit for transforming the time-domain signal of the object under test to a frequency-domain signal of the object under test.

In an embodiment of the present disclosure, the time-domain/frequency-domain transformation unit is a Fourier transformation unit which performs a Fourier transformation on the time-domain signal of the object under test to obtain the frequency-domain signal of the object under test.

In an embodiment of the present disclosure, the frequency-domain signal of the object under test comprises a frequency-domain signal of the spectrum signal of the object under test and a frequency-domain signal of the background noise, the mathematical analysis module filters out the frequency-domain signal of the background noise and reserves the frequency-domain signal of the spectrum signal of the object under test, the mathematical analysis module further comprises a frequency-domain/time-domain transformation unit for transforming the reserved frequency-domain signal of the spectrum signal of the object under test to a filtered time-domain signal of the object under test.

In an embodiment of the present disclosure, the frequency-domain/time-domain transformation unit is an inverse Fourier transformation unit which performs an inverse Fourier transformation on the reserved frequency-domain signal of the spectrum signal of the object under test to obtain the filtered time-domain signal of the object under test.

To achieve an objective of the present disclosure, a light detection apparatus at least comprising a light source controller, a light emitting apparatus, one or more light detectors and a computer is provided. The light source controller is electrically connected to the light emitting apparatus, the light detector is electrically connected to the computer, the light detector receives a light beam emitted by the light emitting apparatus, and a propagation path of the light beam between the light emitting apparatus and the light detector forms a light path. The light emitting apparatus at least comprises a plurality of light emitting units, wherein each of the light emitting units emits light with at least a light emission peak wavelength and at least a wavelength range. An object under test is disposed on the light path, and the light emitting apparatus and the object under test rotate relative to each other.

In an embodiment of the present disclosure, the light emitting units revolve around a revolving axis.

In an embodiment of the present disclosure, the light emitting apparatus is connected to a rotating device, and the rotating device drives the light emitting units to revolve around the revolving axis.

In an embodiment of the present disclosure, the rotating device drives a rotating shaft to rotate, one end of the rotating shaft is connected to the light emitting apparatus, and the rotating shaft works as the revolving axis.

In an embodiment of the present disclosure, the rotating device is electrically connected to a microcontroller of the light source controller, and the microcontroller controls the rotating shaft to rotate at a predetermined angle.

In an embodiment of the present disclosure, the object under test spins with a spin axis.

In the present disclosure, a light emitting method is provided, and the method comprises steps sequentially executed as follows. In a light emitting unit providing step, a plurality of light emitting units are provided, wherein each of the light emitting units emits light with at least a light emission peak wavelength and at least a wavelength range, the wavelength ranges of the two light emitting units corresponding to the two adjacent light emission peak wavelengths are partially overlapped to form a continuous wavelength range which is wider than each of the wavelength ranges of the light emitting units, or alternatively, the wavelength ranges of the two light emitting units corresponding to the two adjacent light emission peak wavelengths are non-overlapped, a difference between the two adjacent light emission peak wavelengths is larger than or equal to 1 nm, and a full-width at half-maximum (FWHM) corresponding to one of the at least partial light emission peak wavelengths is larger than 0 nm and less than or equal to 60 nm. In a light emitting step, the light emitting units are controlled to emit the light, wherein each of the light emitting units discontinuously emits the light with a lighting frequency, the lighting frequency is 0.05-50000 times/second, a light emitting unit turned-on time interval of the lighting frequency is 0.00001-10 seconds, and a light emitting unit turned-off time interval of the lighting frequency is 0.00001-10 seconds.

In the present disclosure, a light emitting method is provided, and the method comprises steps sequentially executed as follows. In a light emitting unit providing step, a plurality of light emitting units are provided, wherein each of the light emitting units emits light with at least a light emission peak wavelength and at least a wavelength range. In a light emitting step, the light emitting units are controlled to emit the light. In an initial spectrum energy distribution curve obtaining step, current densities are respectively provided to the light emitting units, so that the light emitted by each of the light emitting unit has a light intensity, wherein the current densities provided to the light emitting units are the same, so that an initial spectrum energy distribution curve is measured. In a current density adjusting step: the lighting emitting unit corresponding to the light intensity of a specific value among the light intensities is selected, the current density corresponding to the non-selected light emitting unit is increased or decreased, so to make the light intensity corresponding to the non-selected light emitting unit similar or approximate to the light intensity corresponding to the selected light emitting unit.

In an embodiment of the present disclosure, the wavelength ranges of the two light emitting units corresponding to the two adjacent light emission peak wavelengths are partially overlapped to form a continuous wavelength range which is wider than each of the wavelength ranges of the light emitting units, or alternatively, the wavelength ranges of the two light emitting units corresponding to the two adjacent light emission peak wavelengths are non-overlapped, a difference between the two adjacent light emission peak wavelengths is larger than or equal to 1 nm, and a full-width at half-maximum (FWHM) corresponding to one of the at least partial light emission peak wavelengths is larger than 0 nm and less than or equal to 60 nm.

In an embodiment of the present disclosure, each of the light emitting units discontinuously emits the light with a lighting frequency, the lighting frequency is 0.05-50000 times/second, a light emitting unit turned-on time interval of the lighting frequency is 0.00001-10 seconds, and a light emitting unit turned-off time interval of the lighting frequency is 0.00001-10 seconds.

In the present disclosure, a spectrum detection method is provided, comprises the steps of the above light emitting method, and further comprises steps as follows. In a filtering step, a spectrum signal of an object under test and a background noise are received during a light emitting unit turned-on time interval of the lighting frequency, wherein a received signal is a composite signal of a background noise and a spectrum signal of an object under test, the received signal during a light emitting unit turned-off time interval of the lighting frequency is the background noise, and the spectrum signal of the object under test and the background noise forms a time-domain signal of the object under test; then, a Fourier transformation is performed on the time-domain signal of the object under test to obtain a frequency-domain signal of the object under test, wherein the frequency-domain signal of the object under test comprises a frequency-domain signal of the spectrum signal of the object under test and a frequency-domain signal of the background noise; and next, the frequency-domain signal of the background noise is filtered out and the frequency-domain signal of the spectrum signal of the object under test is reserved.

In an embodiment of the present disclosure, the spectrum detection method further comprises an inverse transformation performing step. In the inverse transformation performing step, an inverse Fourier transformation is performed on the reserved frequency-domain signal of the spectrum signal of the object under test to obtain the filtered time-domain signal of the object under test.

In the present disclosure, a lighting correction method is provided, and comprises steps sequentially executed as follows. In a correction relation obtaining step, a plurality of light emitting units are provided, wherein each of the light emitting units emits light with at least a light emission peak wavelength and at least a wavelength range, and the light emitted by each of the light emitting unit has a light intensity; and then, a mathematical relation or a relation table or graph having relationship of the light intensity or the relative intensity of each of the light emitting units and a junction temperature is obtained, and also a mathematical relation or a relation table or graph having relationship of a forward bias of each of the light emitting units and the junction temperature is obtained. In a forward bias measuring step, during a light emitting unit turned-on time interval, the forward bias of the light emitting unit is measured. In a ratio relation obtaining step, based on the obtained mathematical relation or the relation table or graph having relationship of the forward bias of each of the light emitting units and the junction temperature, the measured forward bias is mapped to calculate the junction temperature. Next, based on the obtained mathematical relation or the relation table or graph having relationship of the light intensity or the relative intensity of each of the light emitting units and a junction temperature, the calculated junction temperature is mapped to calculate the light intensity or the relative intensity; and next, the calculated light intensity or the calculated relative intensity and a light intensity or a relative intensity corresponding to a specific junction temperature are compared to obtain a ratio relation, wherein the light intensity or the relative intensity corresponding to the specific junction temperature is obtained from the mathematical relation or the relation table or graph having relationship of the light intensity or the relative intensity of each of the light emitting units and a junction temperature. In a correction completing step, the light intensity of the wavelength range corresponding to the light emitting unit in the initial spectrum energy distribution curve is multiplied by the ratio relation to achieve correction of the light intensity; or a measured spectrum signal of the wavelength range corresponding to the light emitting unit is multiplied by the ratio relation to achieve correction of the spectrum signal.

DESCRIPTIONS OF DRAWINGS

Figure 6A:
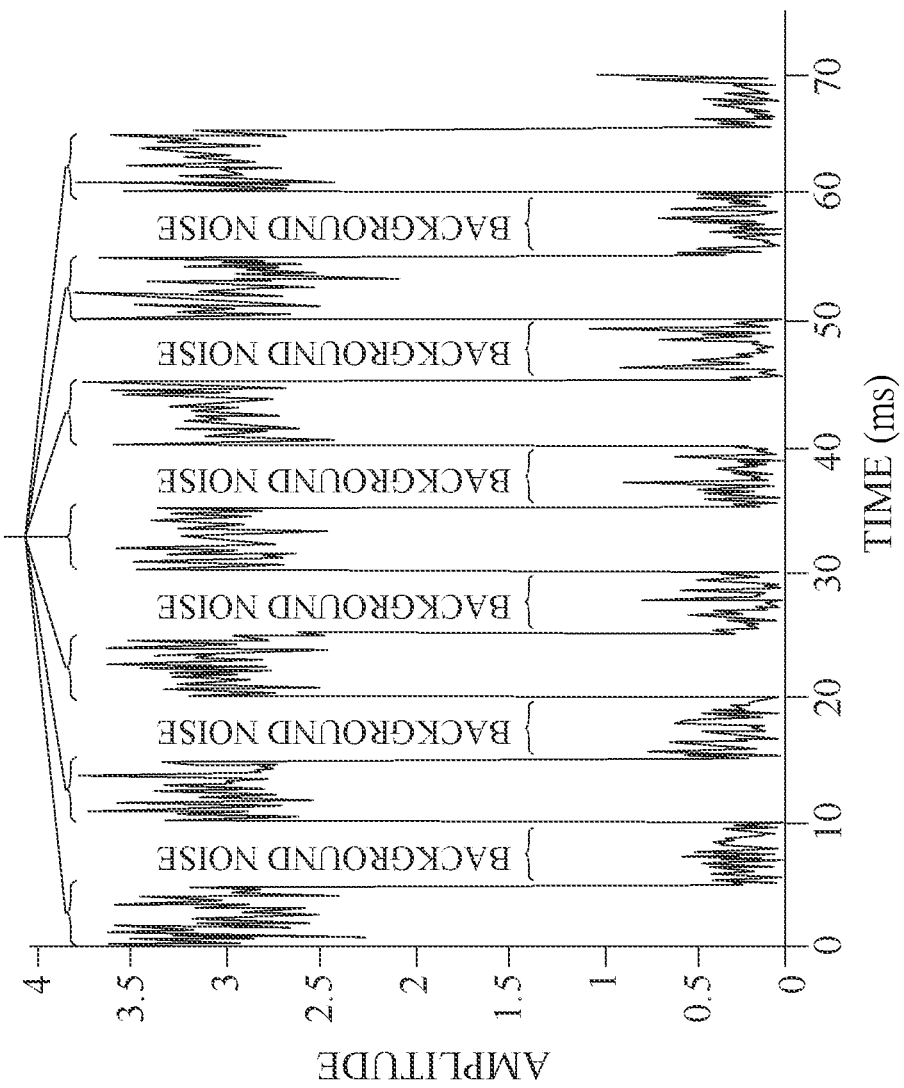
FIG. 6A is a schematic diagram showing a time-domain signal of an object under test measured by a light detection apparatus of the present disclosure.
Figure 6B:
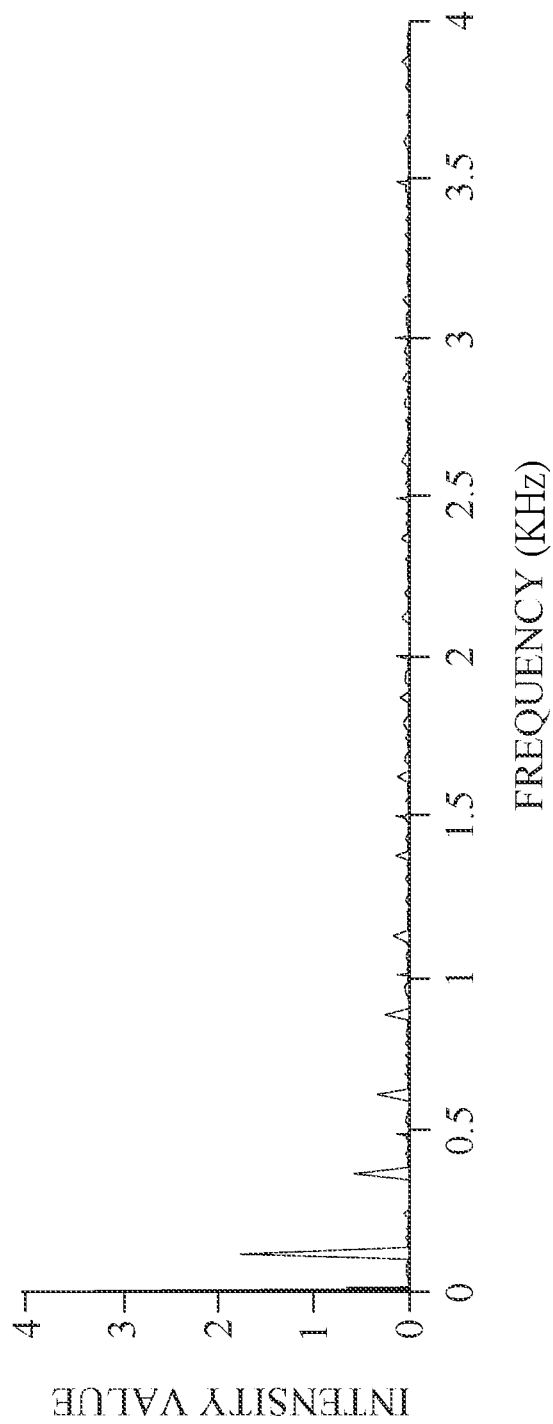
FIG. 6B is a schematic diagram showing a frequency-domain signal of the object under test which the time-domain signal of the object under test measured by the light detection apparatus of the present disclosure is performed with a Fourier transformation.
Figure 6C:
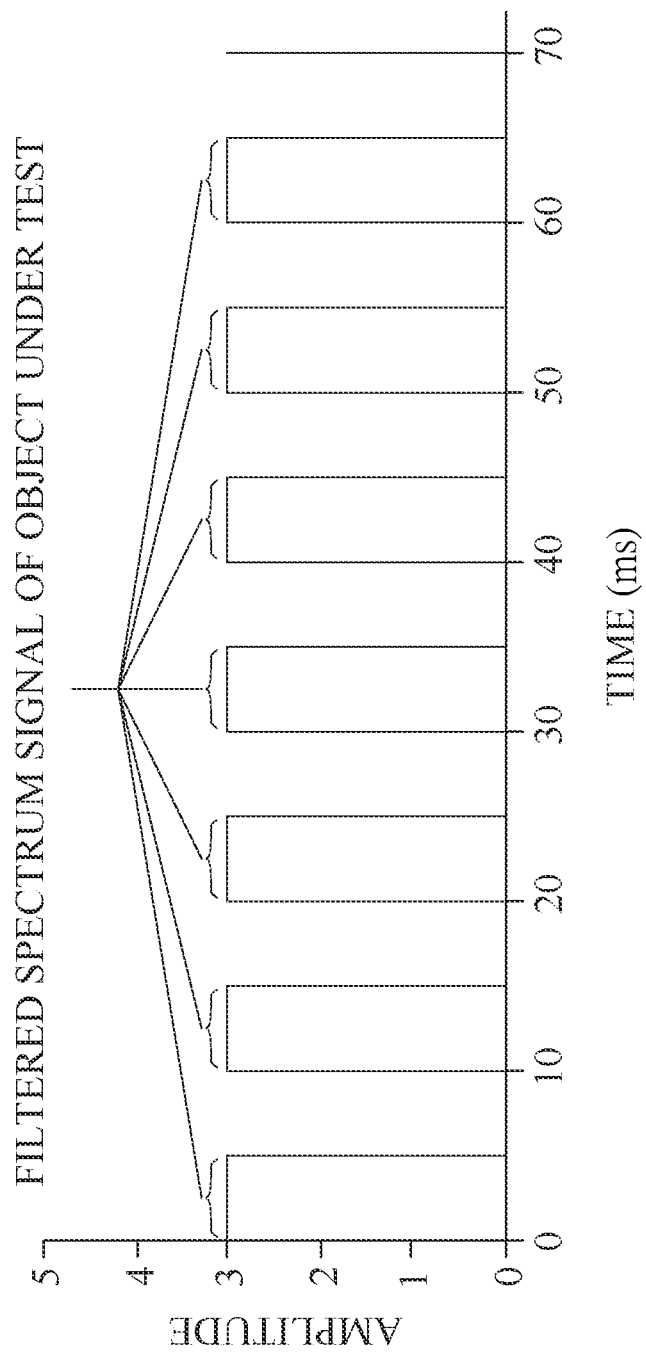

FIG. 6C is a schematic diagram showing a filtered time-domain signal of the object under test after the reserved frequency-domain signal of a spectrum signal of the object under test is performed with an inverse Fourier transformation, wherein frequency-domain signal of the object under test is filtered by the light detection apparatus to form the reserved frequency-domain signal of a spectrum signal of the object under test.

Figure 7A:
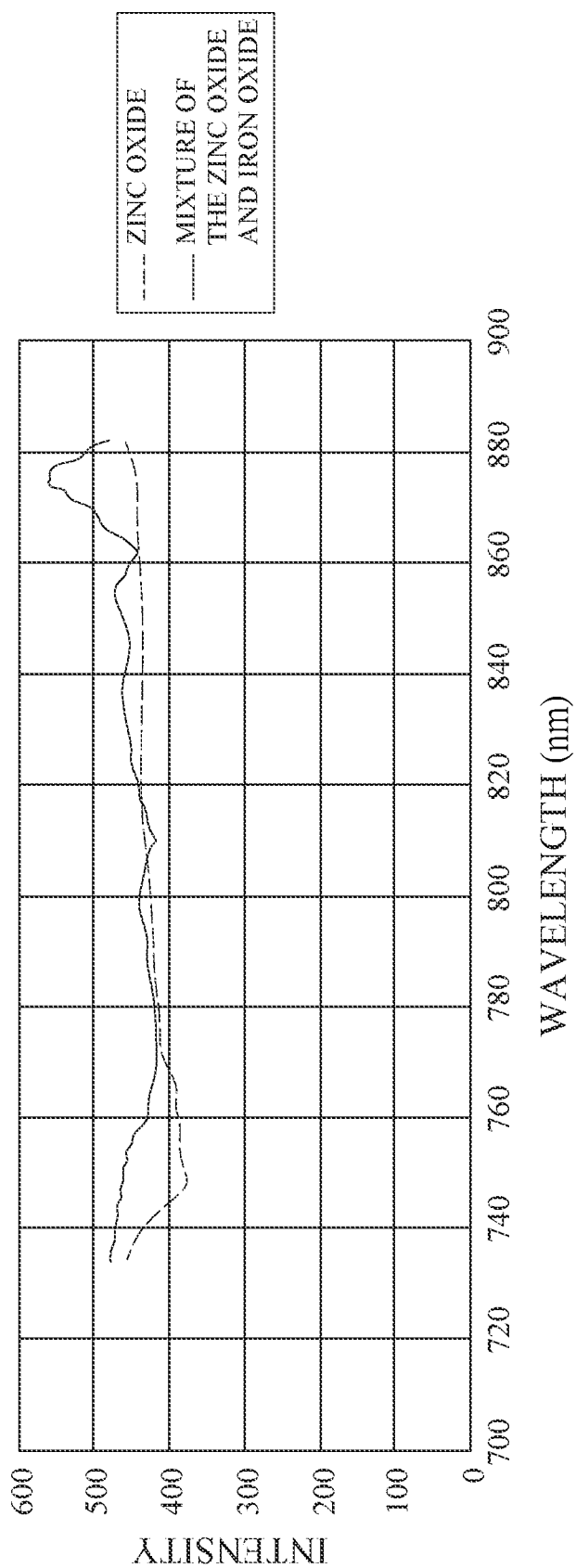

FIG. 7A is a schematic diagram showing reflection spectrums of zinc oxide and mixture of the zinc oxide and iron oxide of a first comparative example, wherein the reflection spectrums are measured by a conventional spectrometer.

Figure 7B:
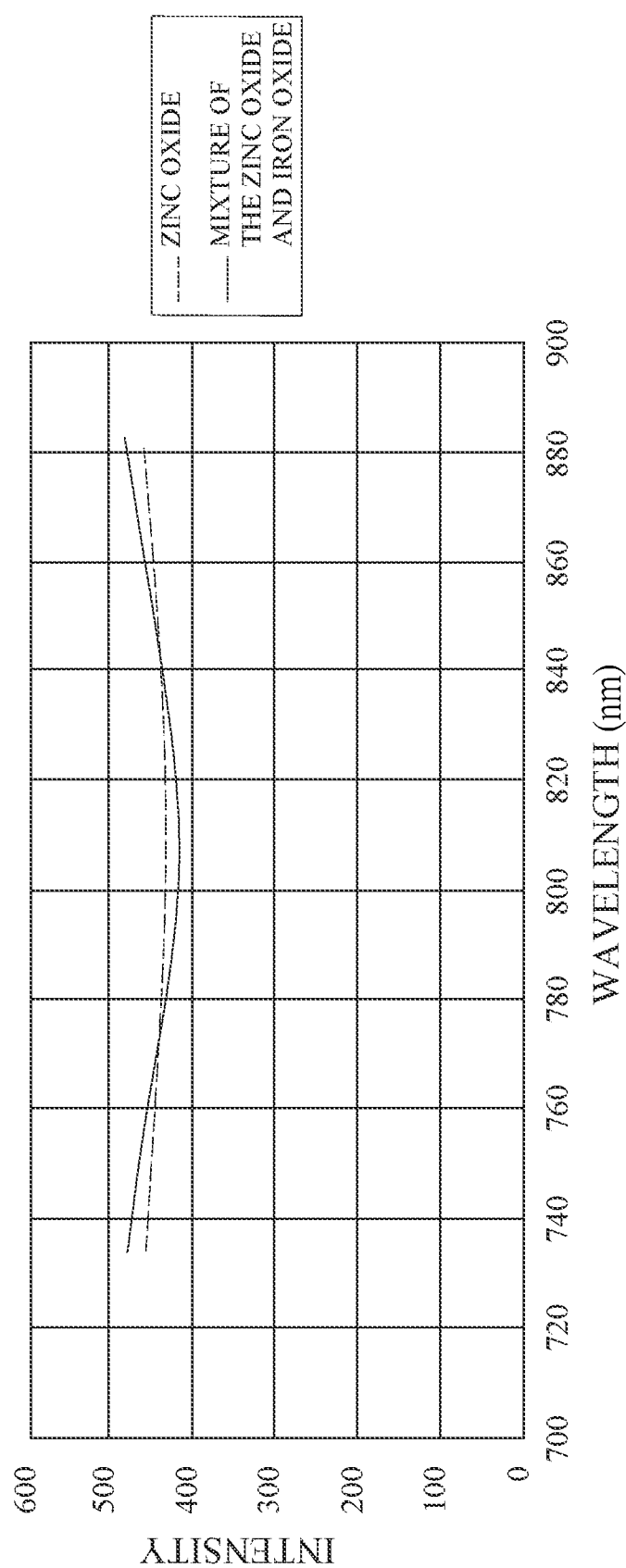

FIG. 7B is a schematic diagram showing reflection spectrums of zinc oxide and mixture of the zinc oxide and iron oxide of a first application example, wherein the reflection spectrums are measured by a light detection apparatus of the present disclosure.

Figure 7C:
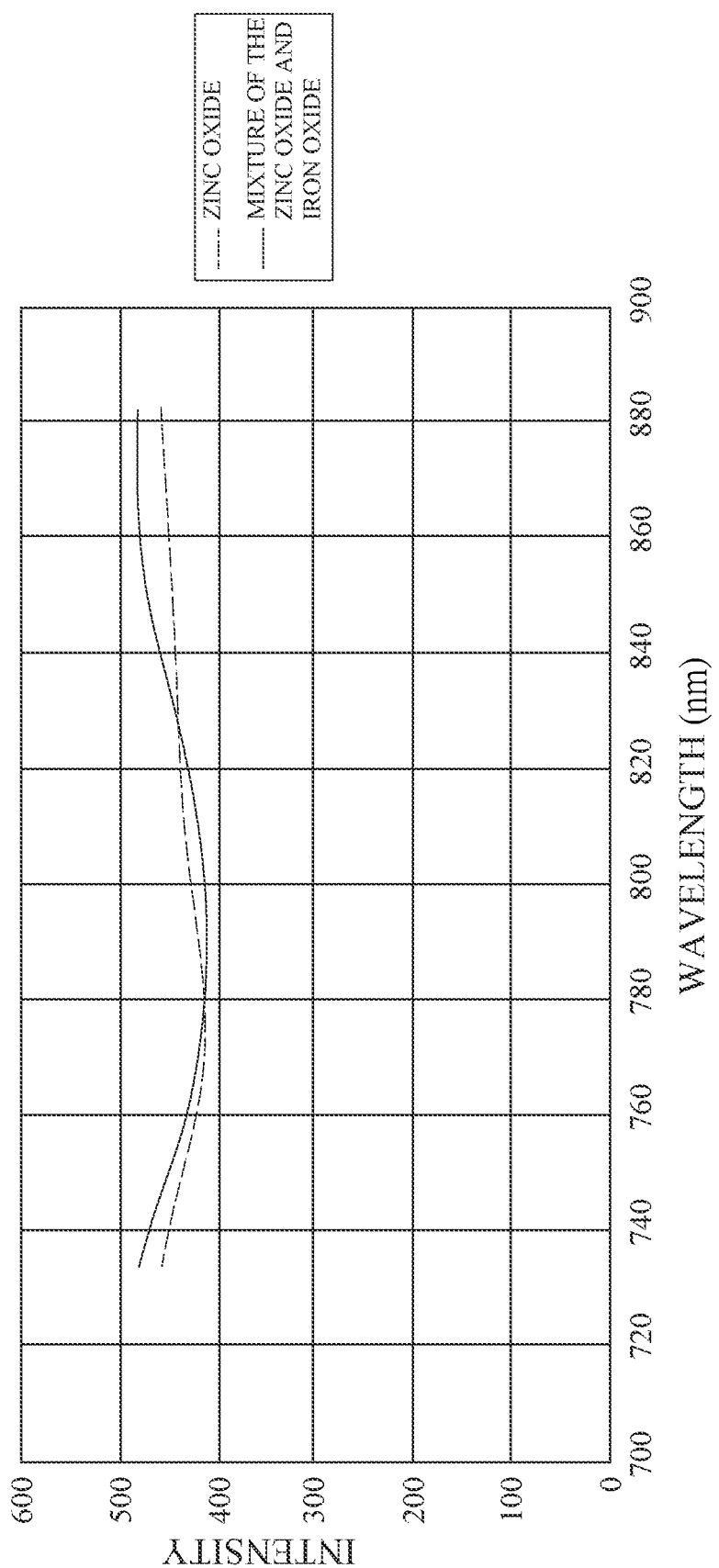

FIG. 7C is a schematic diagram showing reflection spectrums of zinc oxide and mixture of the zinc oxide and iron oxide of a second application example, wherein the reflection spectrums are measured by a light detection apparatus of the present disclosure.

Figure 7D:
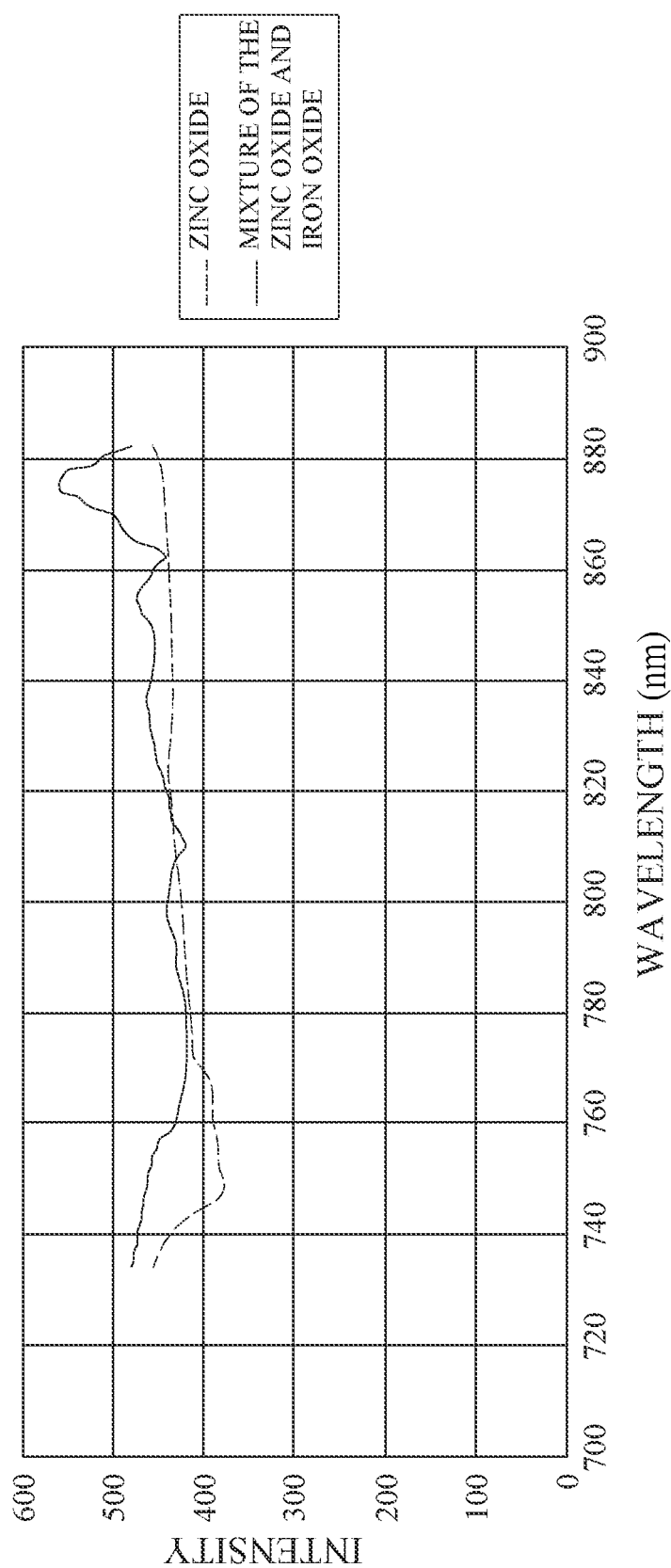

FIG. 7D is a schematic diagram showing reflection spectrums of zinc oxide and mixture of the zinc oxide and iron oxide of a third application example, wherein the reflection spectrums are measured by a light detection apparatus of the present disclosure.

Figure 8:
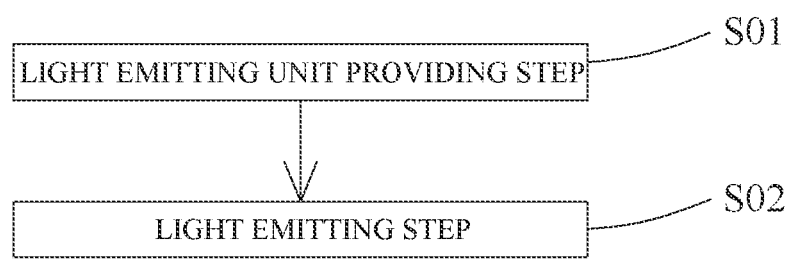

FIG. 8 is flowchart of a light emitting method of the present disclosure.

Figure 9:
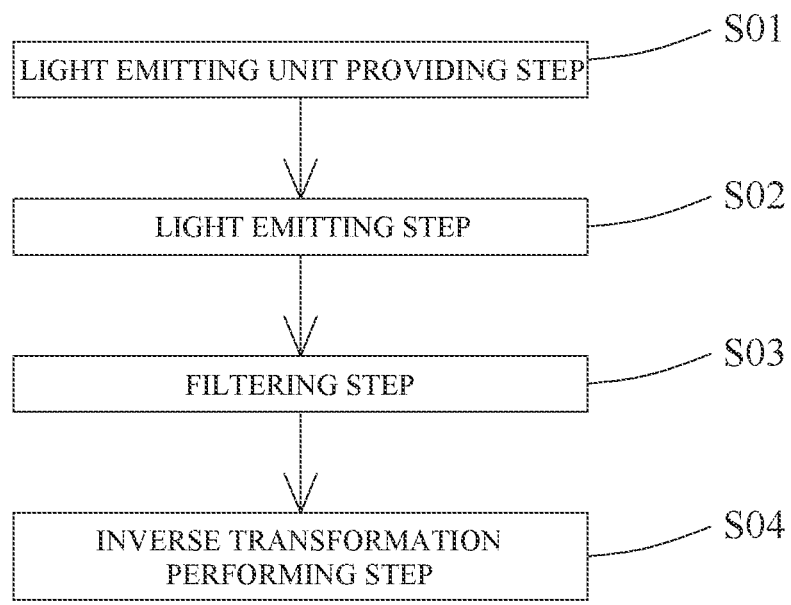

FIG. 9 is flowchart of a spectrum detection method of the present disclosure.

Figure 10A:
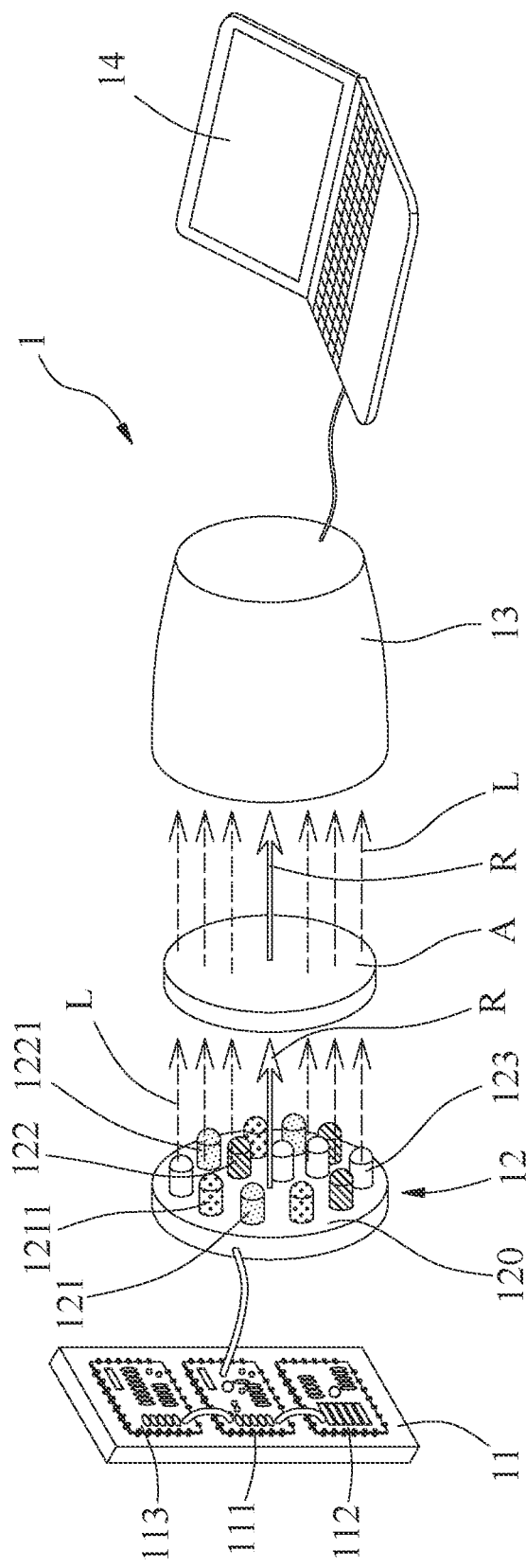

FIG. 10A is a first schematic diagram showing an implementation of a light detection apparatus with a current controller of the present disclosure.

Figure 10B:
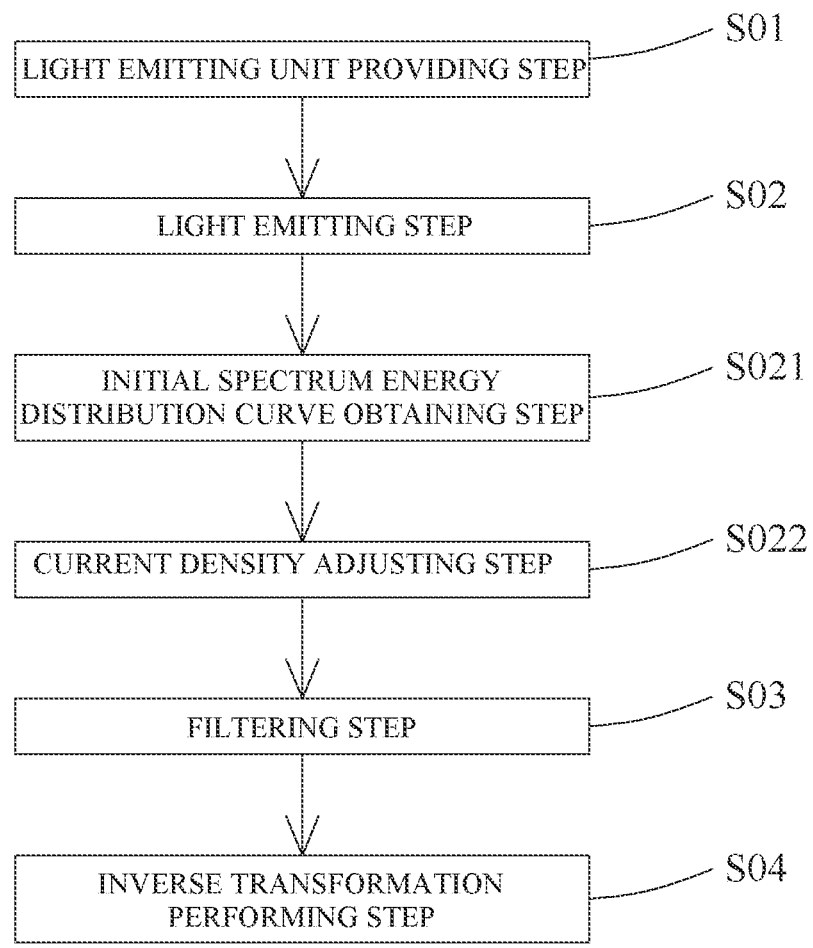

FIG. 10B is flowchart of another light emitting method and another spectrum detection method of the present disclosure.

Figure 10C:
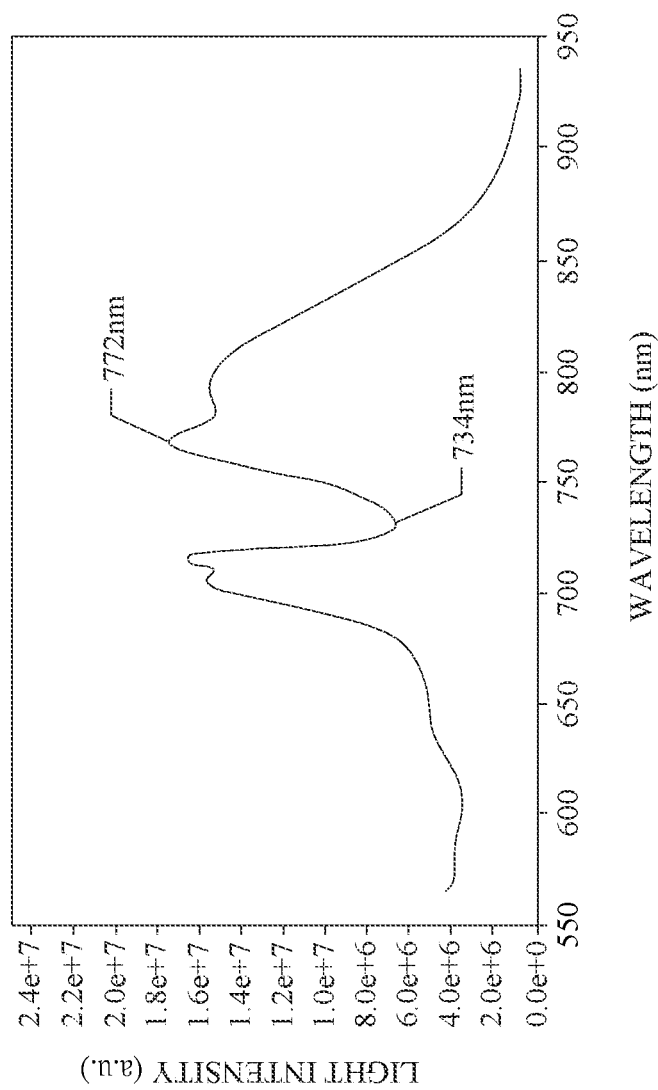

FIG. 10C is a curve diagram showing an initial spectrum energy distribution curve of a light emitting apparatus of the present disclosure.

Figure 10D:
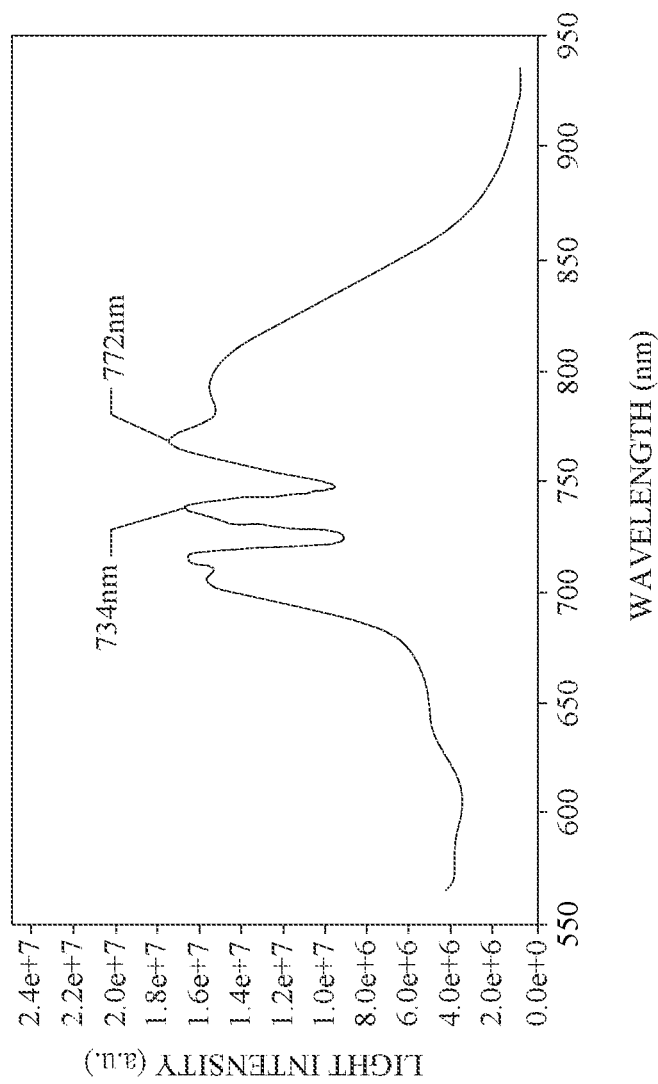

FIG. 10D is a curve diagram showing a spectrum energy distribution curve of the present disclosure after a first current density is adjusted.

Figure 10E:
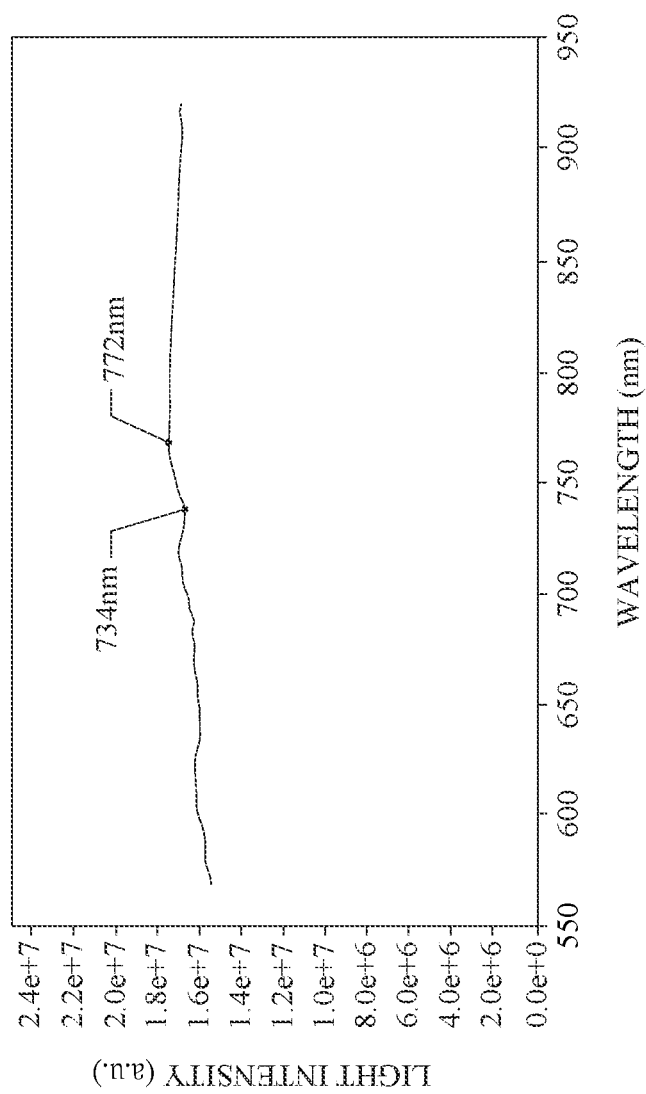

FIG. 10E is a curve diagram showing a spectrum energy distribution curve of the present disclosure after other current densities is adjusted.

Figure 11A:
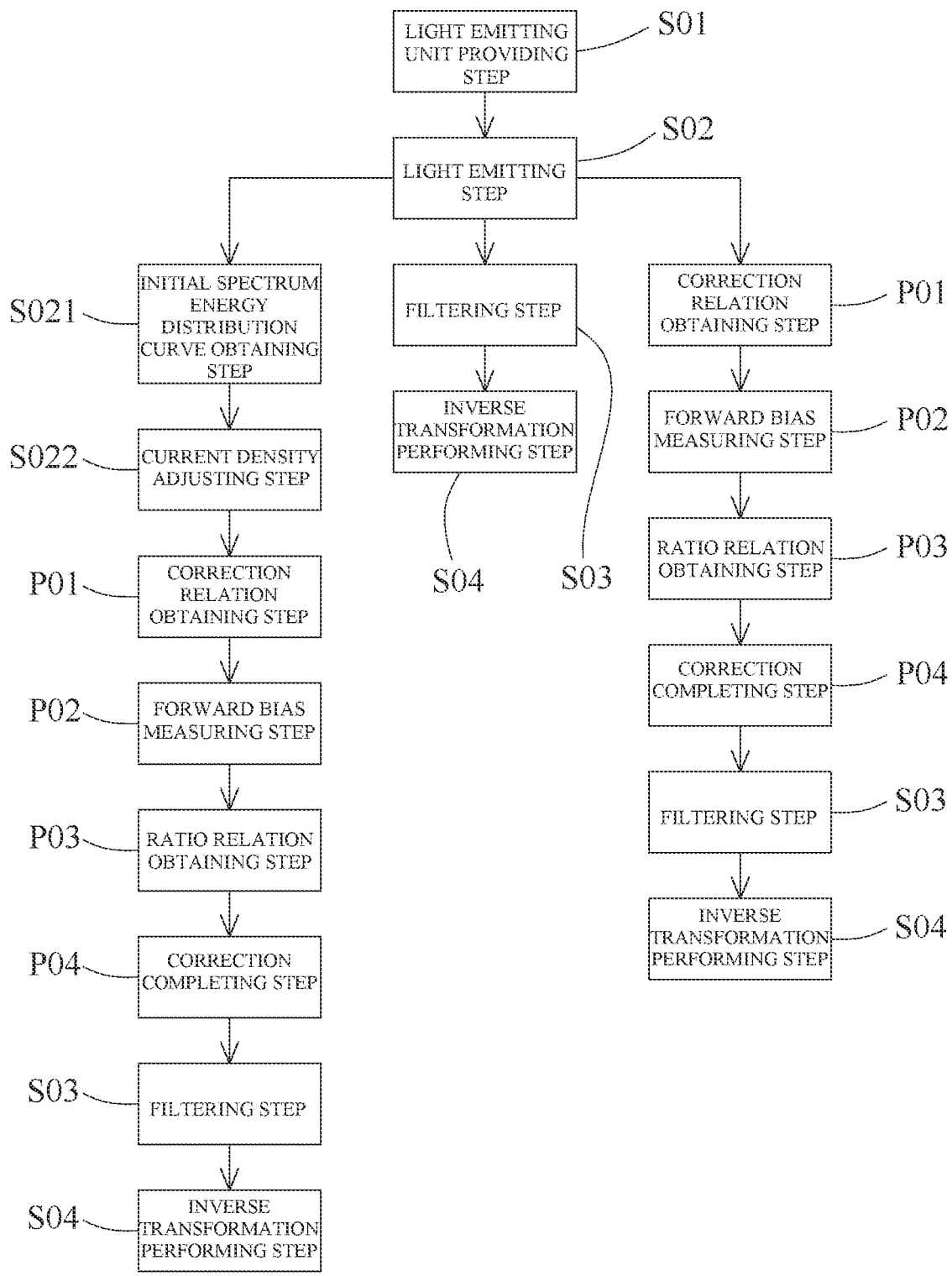

FIG. 11A is flowchart of a lighting correction method, a light emitting method and a spectrum detection method of the present disclosure.

Figure 11B:
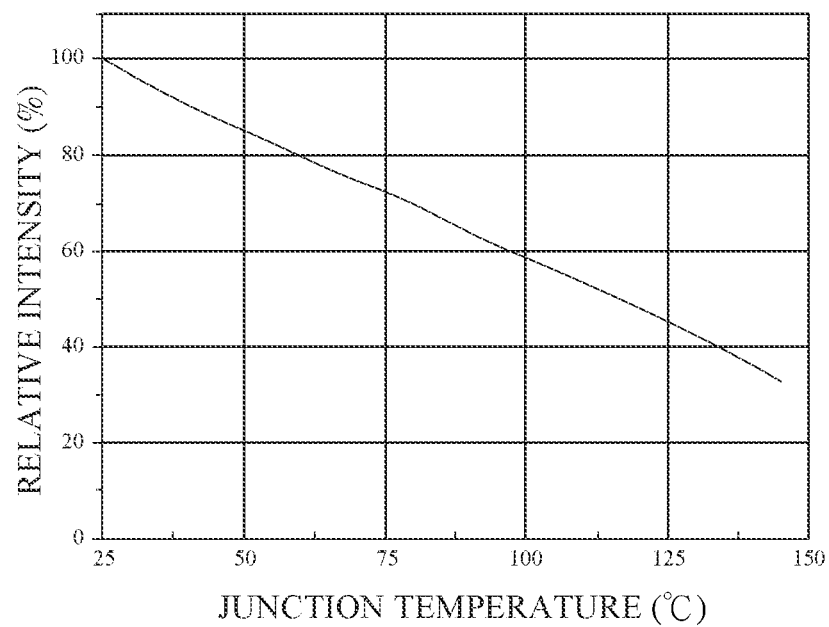

FIG. 11B is a schematic diagram showing relation of a relative intensity and a junction temperature of the fourth LED of the present disclosure.

Figure 11C:
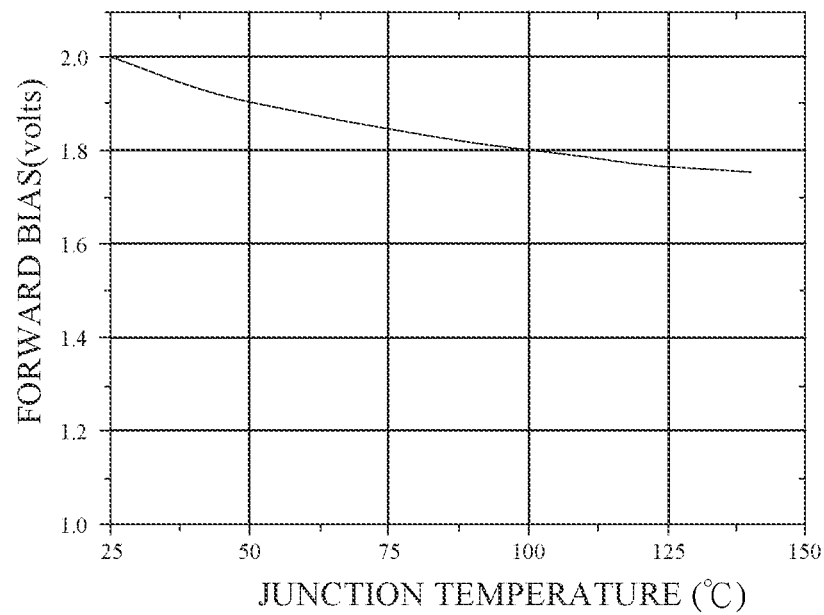

FIG. 11C is a schematic diagram showing relation of a forward bias and a junction temperature of the fourth LED of the present disclosure.

Figure 12A:
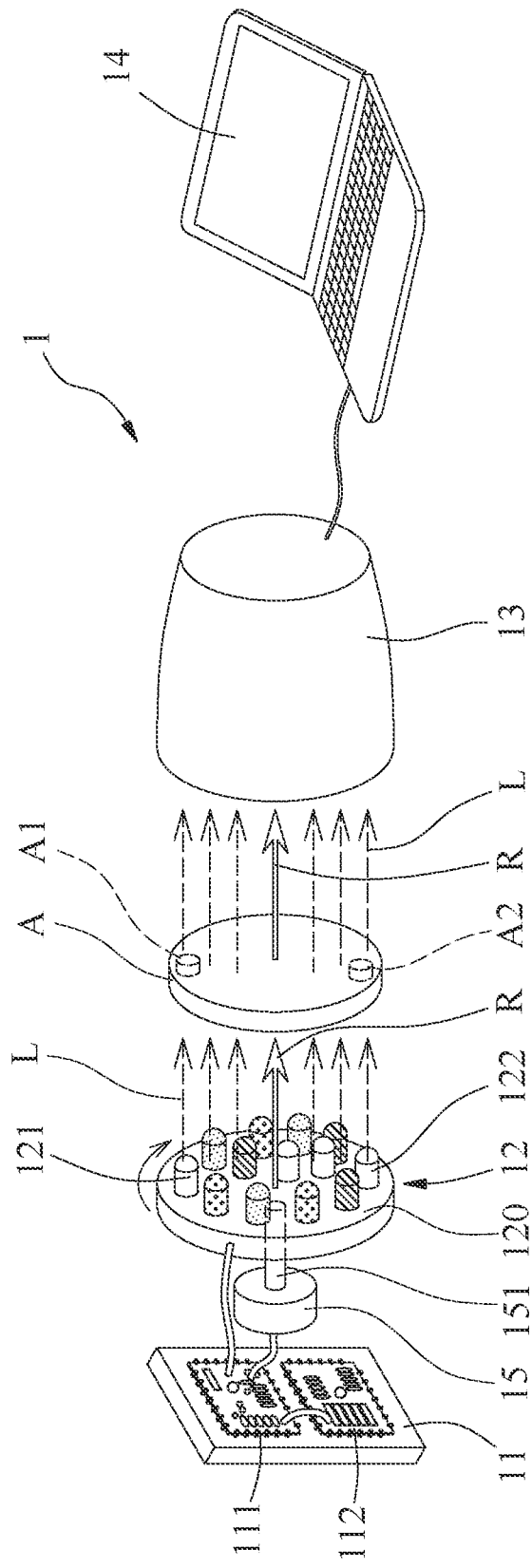

FIG. 12A is a schematic diagram showing the first LED and the first region of the present disclosure form a first relative location.

Figure 12B:
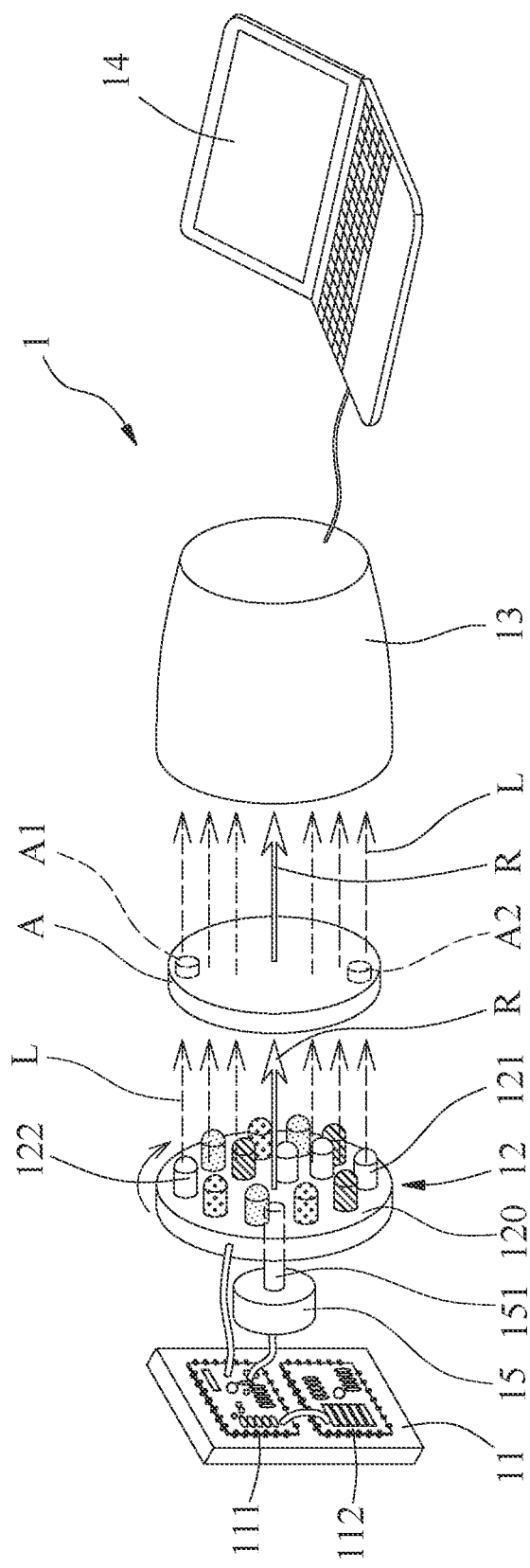

FIG. 12B is a schematic diagram showing the first LED and the first region of the present disclosure form a second relative location.

Figure 12C:
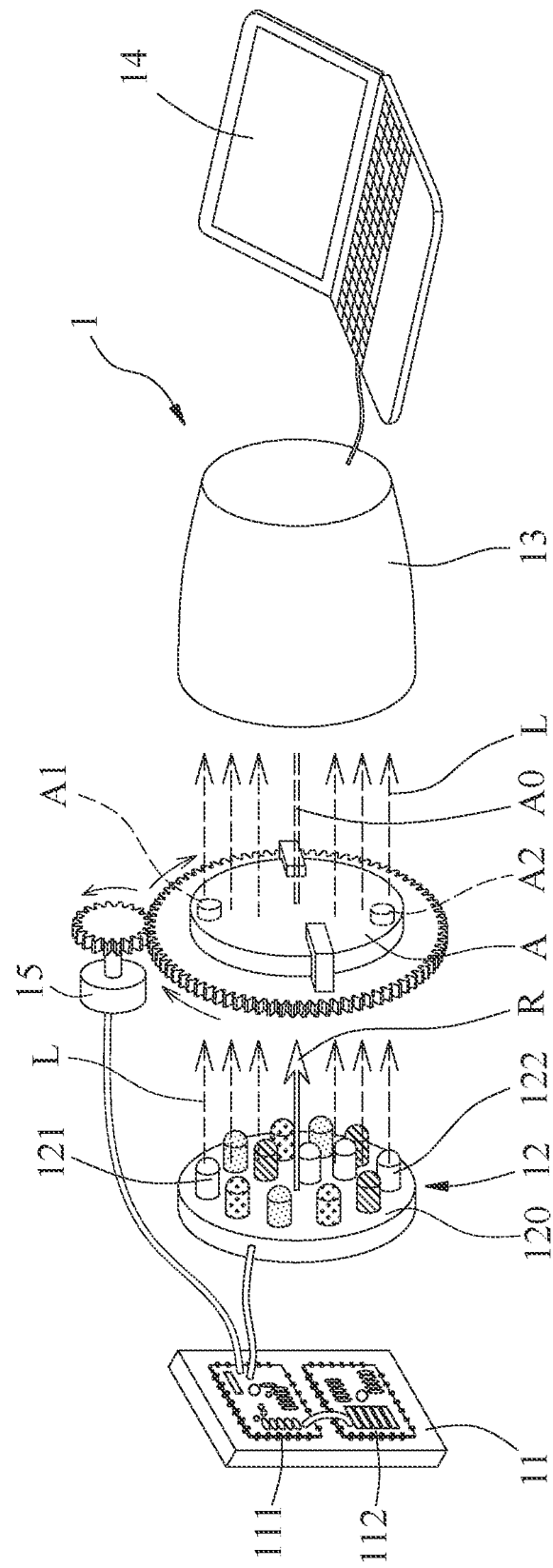

FIG. 12C is a schematic diagram showing the object under test of the present disclosure spins with a spin axis.

Figure 12D:
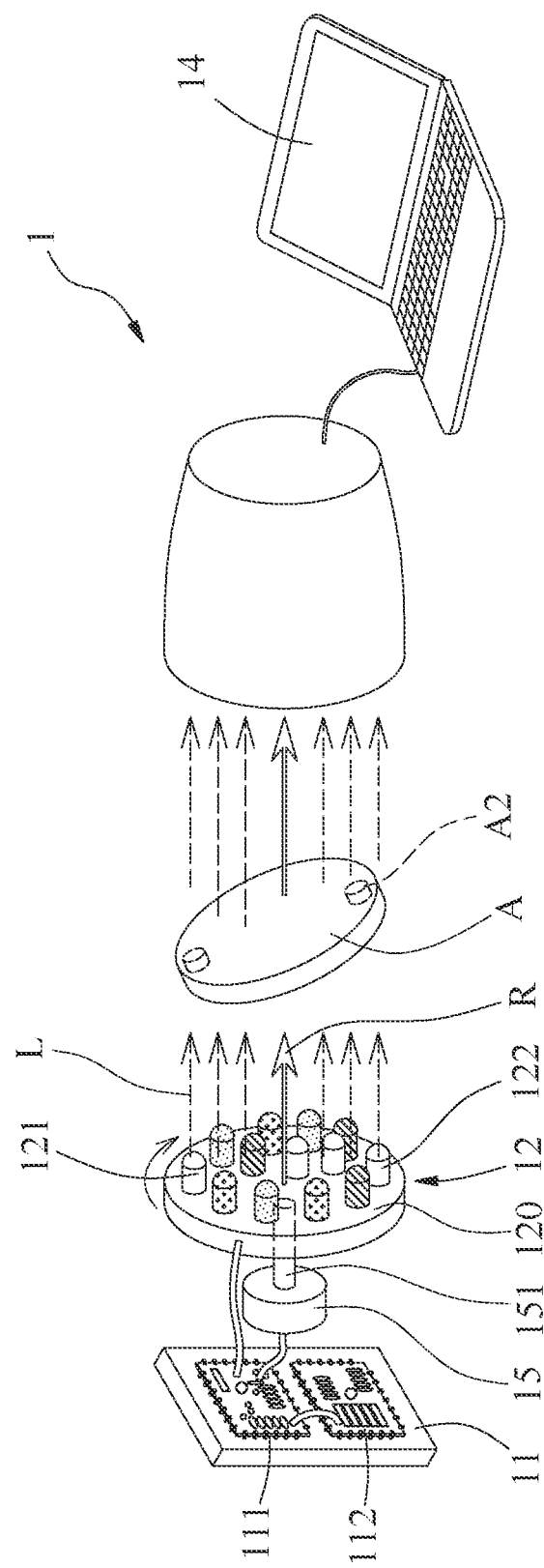

FIG. 12D is a first schematic diagram showing a surface of the object under test of the present disclosure a surface of the object under test of the present disclosure is unable to remain parallel to the light emitting apparatus.

Figure 12E:
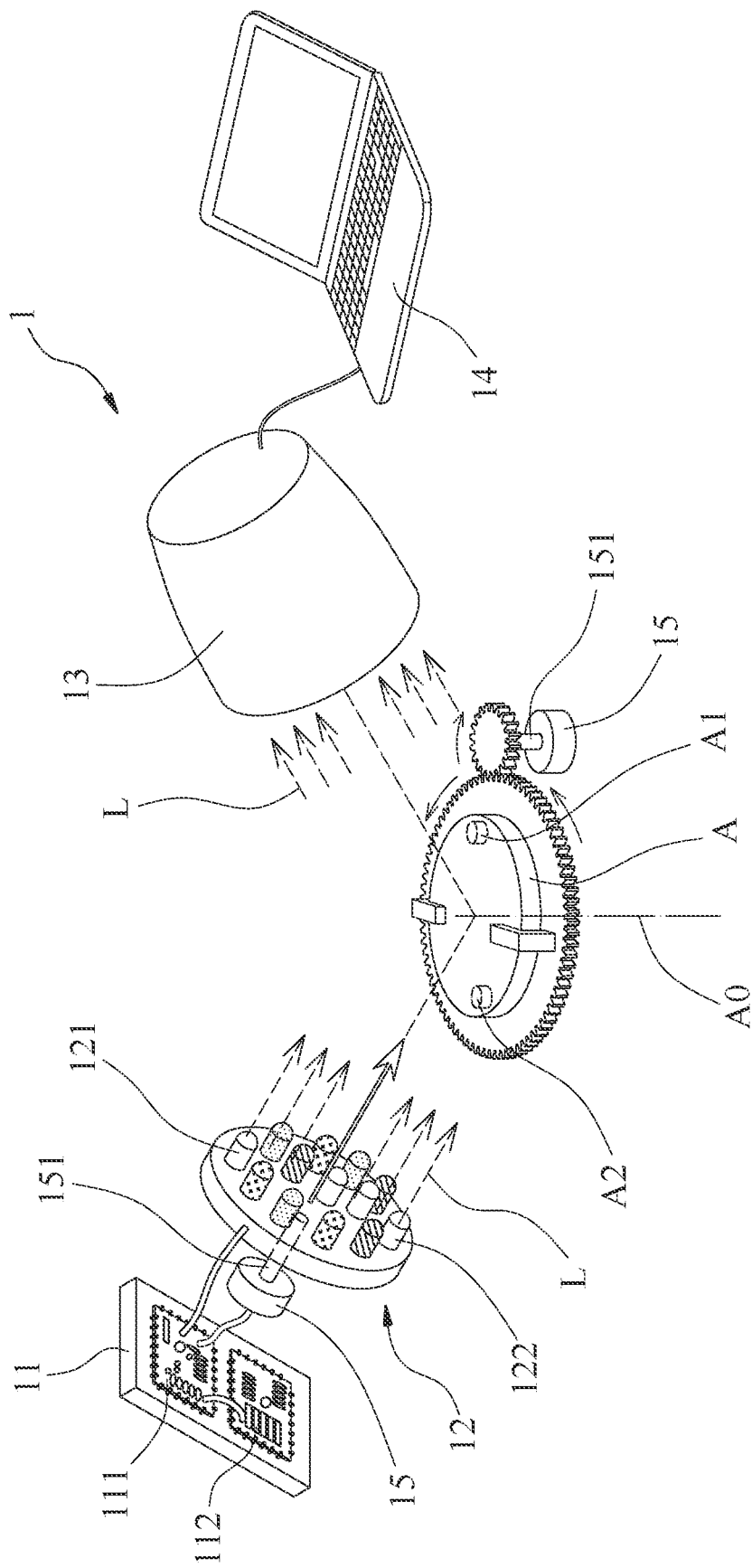

FIG. 12E is a second schematic diagram showing a surface of the object under test of the present disclosure a surface of the object under test of the present disclosure is unable to remain parallel to the light emitting apparatus.

DETAILS OF EXEMPLARY EMBODIMENTS

The following describes the implementation of the present invention by exemplary embodiments. Those skilled in the art can easily understand other advantages and effects of the present disclosure from the contents disclosed in this specification. It should be noted that the structure, ratio, size, and etc., shown in the drawings in this specification are only used to explain the contents disclosed in the specification, for those familiar with this technology to understand and read, not to limit the present disclosure. The above limitations that can be implemented may not have any technical significance. Any structural modifications, changes in proportional relationship or size adjustments should still fall within the scope of the technical content disclosed by the present disclosure, without affecting the effectiveness and the purpose of the present disclosure.

Figure 1:
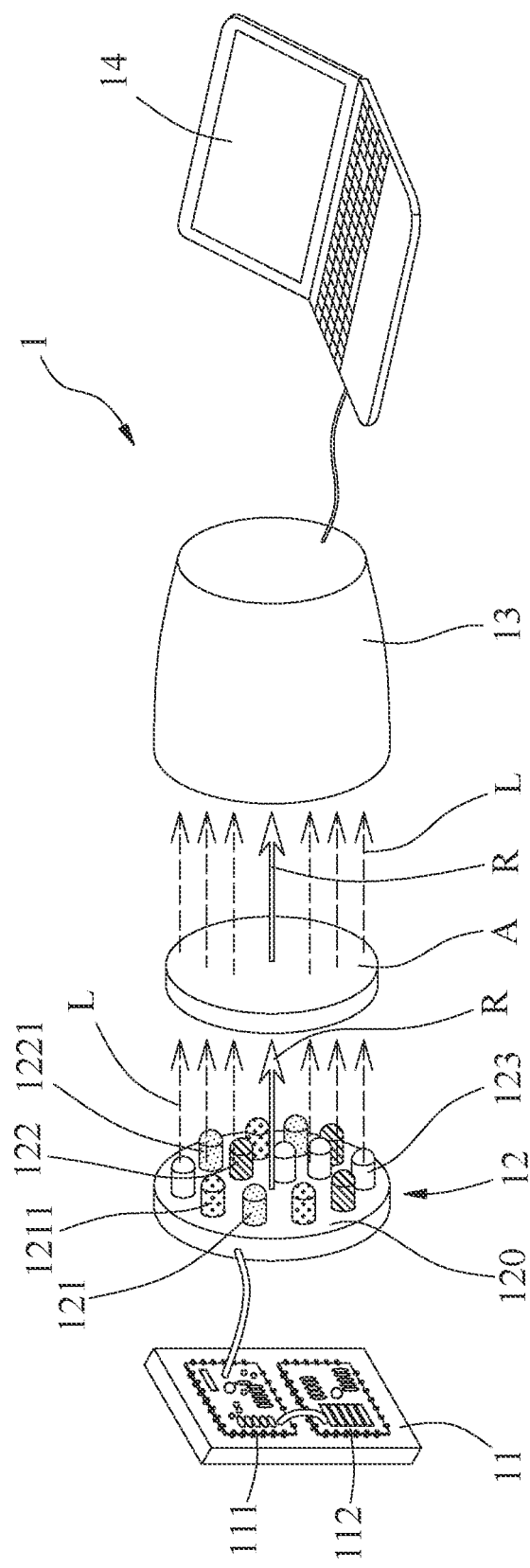
FIG. 1 is a first schematic diagram showing implementations of a light emitting apparatus and a light detection apparatus of the present disclosure.

Refer to FIG. 1, and a first embodiment of a light emitting apparatus 12 is illustrated. The light emitting apparatus 12 is used in a light detection apparatus 1. The light detection apparatus 1 comprises a light source controller 11, the light emitting apparatus 12, one or more light detectors 13 and a computer 14. The light source controller 11 is electrically connected to the light emitting apparatus 12 and an external power supply (not shown in drawings). The light detector 13 is electrically connected to computer 14. The light detector 13 receives a light beam L emitted by the light emitting apparatus 12. A propagation path of the light beam L between the light emitting apparatus 12 and the light detector 13 forms a light path R. The light detector 13 can be, for example, a photomultiplier, a photoconducting detector, or a Si bolometer. An object A under test is placed on the light path R, the light path R passes through the object A under test or the light path R forms a reflection on the surface of the object A under test. In FIG. 1, take the light path R passing through the object A under test as an example, and an absorption spectrum of the object A under test is measured. In addition, in other one embodiment in which the light path R forms a reflection on the surface of the object A under test, the reflection spectrum of the object A under test is measured (see FIG. 12E). The light detector 13 converts the light beam L into a spectrum signal of the object A under test and transmits the spectrum signal of the object A under test to the computer 14. The computer 14 converts the spectrum signal of the object A under test to form a spectrogram of the object A under test. The computer 14 is, for example, a personal computer, a notebook computer or a computer server.

The light emitting apparatus 12 at least comprises multiple light emitting units. Each of the light emitting units emits light with at least a light emission peak wavelength and at least a wavelength range. The light emission peak wavelength or the wavelength range is 300-2500 nm, wherein the can be a LED, a VCSEL or a LD. The light emitting unit in the following embodiments is an example of an LED, which is for the convenience of description, and is not limited to the example of the LED in the present disclosure. Those skilled in the art should know the type of the light emitting unit can understand that LED, VCSEL or LD can be replaced with each other in the present disclosure, and will not affect the actual implementation of the present disclosure. In the embodiment of FIG. 1, the light emitting apparatus 12 comprises three LEDs, which are respectively a first LED 121, a second LED 122 and a third LED 123. The first LED 121 emits a first light beam with a first wavelength range, the second LED 122 emits a second light beam with a second wavelength range, and the third LED 123 emits a third light beam with a third wavelength range. The first light beam has a first light emission peak wavelength in the first wavelength range, the second light beam has a second light emission peak wavelength in the second wavelength range, and the third light beam has a third light emission peak wavelength in the third wavelength range. The first LED 121, the second LED 122 and the third LED 123 are electrically connected to a circuit board 120 of the light emitting apparatus 12. The circuit board 120 is electrically connected to the light source controller 11. In other words, the light source controller 11 is electrically connected to the first LED 121, the second LED 122 and the third LED 123, and the light source controller 11 can respectively control the first LED 121, the second LED 122 and the third LED 123 to be turned on or off (lighten or extinguished, conductive or inconductive). That is, the light source controller 11 can respectively control the LEDs to be turned on or off (lighten or extinguished). Preferably, the light source controller 11 can control the first LED 121, the second LED 122 and the third LED 123 to respectively emit light continuously or discontinuously, that is to say, the light source controller 11 can control the LEDs respectively to emit light continuously or respectively discontinuously. More preferably, the light source controller 11 can control each of the first LED 121, the second LED 122 and the third LED 123 to discontinuously emit the light with a lighting frequency, that is to say, the light source controller 11 can control each of the LEDs to discontinuously emit the light with a lighting frequency, and all of the lighting frequencies are identical to or different from each other, or partial of the lighting frequencies are identical to or different from each other. For example, the light source controller 11 comprises a microcontroller 111 and a clock generator 112, the microcontroller is electrically connected to the external power source, and the clock generator 112 is electrically connected to the microcontroller 111. Each of the lighting frequencies is generated by the clock generator 112, then the signals of the lighting frequencies are transmitted to the microcontroller 111, and next the microcontroller 111 turns on or off the LEDs (for example, the first LED121, the second LED122 and the third LED123) electrically connected to the microcontroller 111 according to the lighting frequencies. In particular, the clock generator 112 can also be a clock generator module integrated in the microcontroller 111 to generate the lighting frequency. The clock generator module can be a software or hardware based module, and in this way, the clock generator 112 does not need to be additionally set outside the microcontroller 111. It is particularly noted that, according to the technical features of the light source controller 11, the LEDs can be turned on or off at the same time according to actual needs, or only one or a part of the LEDs can be selectively turned on or off, or the LEDs can be turned on or off in sequence, or the LEDs can be turned on or off according to the above lighting frequencies. Preferably, the LEDs are turned on (lighten) at the same time, but the corresponding lighting frequencies are different from each other; more preferably, at least four of the LEDs are turned on at the same time, and the four lighting frequencies corresponding to the four LEDs are optionally completely different from each other or at least partially the same as each other.

Figure 2:
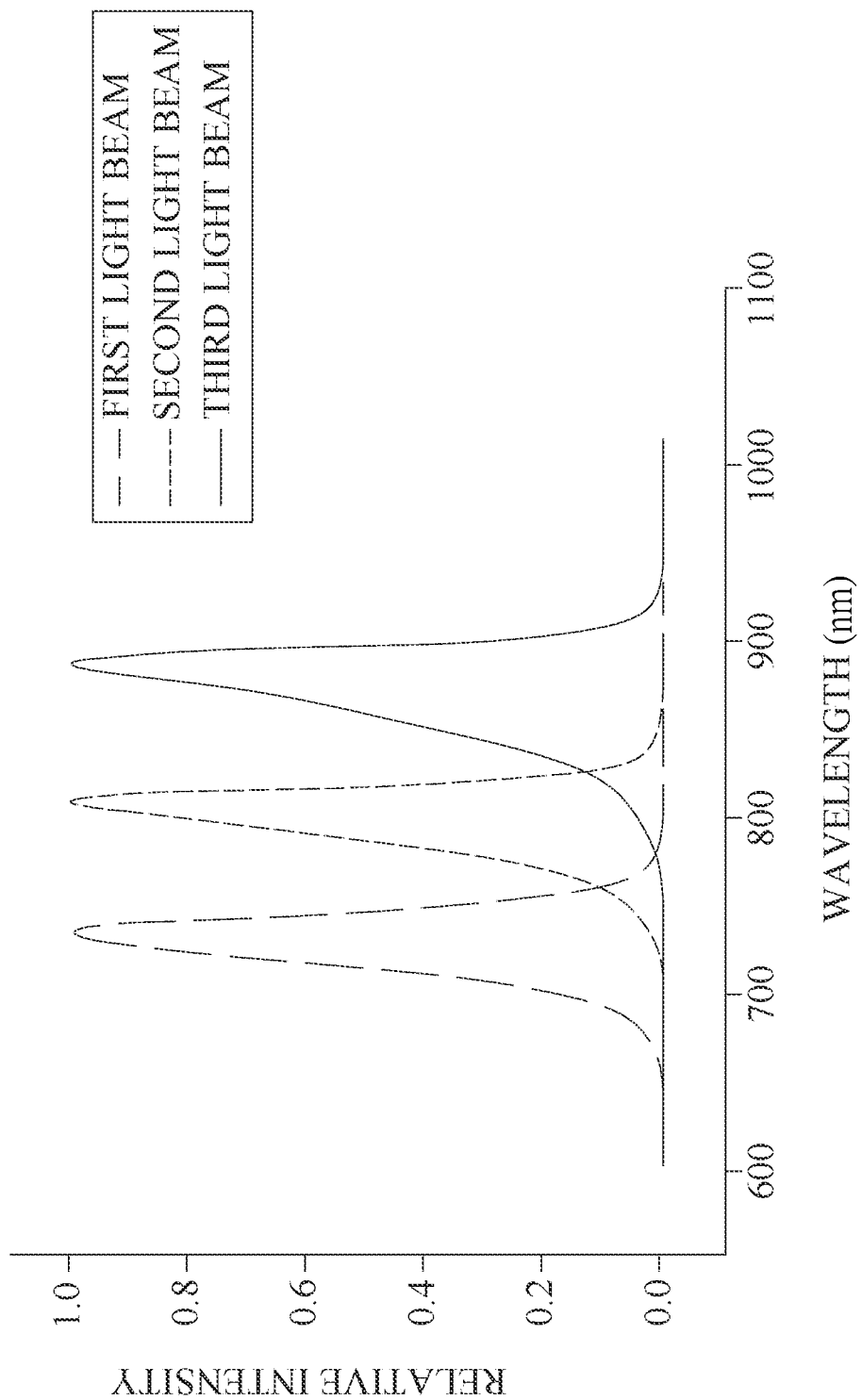
FIG. 2 is schematic diagram showing emission spectrums of LEDs according to a first embodiment of the present disclosure.

Refer to FIG. 2, and the wavelength ranges of the two LEDs corresponding to the two adjacent light emission peak wavelengths are partially overlapped to form a continuous wavelength range which is wider than each of the wavelength ranges of the LEDs, wherein the continuous wavelength range is 300-2500 nm. In FIG. 2, there are three light emission peak wavelengths and three wavelength ranges corresponding to the three light emission peak wavelengths, and the three wavelength ranges respectively are a first wavelength range corresponding to the first light emission peak wavelength (734 nm) of the first light beam, a second wavelength range corresponding to the second light emission peak wavelength (810 nm) of the second light beam and a third wavelength range corresponding to the third light emission peak wavelength (882 nm) of the third light beam. The first light emission peak wavelength and the second light emission peak wavelength are two adjacent light emission peak wavelengths, and in similar, the second light emission peak wavelength and the third light emission peak wavelength are other two adjacent light emission peak wavelengths. The first wavelength range corresponding to the first light emission peak wavelength is 660-780 nm, the second wavelength range corresponding to the second light emission peak wavelength is 710-850 nm, and the first wavelength range and the second wavelength range partially overlap between 710 nm and 780 nm, so the first wavelength range and the second wavelength range together form the continuous wavelength range between 660 nm and 850 nm. Similarly, the second wavelength range corresponding to the second light emission peak wavelength is 710-850 nm, the third wavelength range corresponding to the third light emission peak wavelength is 780-940 nm, and the second wavelength range and the third wavelength range partially overlap between 780 nm and 850 nm, so the second wavelength range and the third wavelength range together form the continuous wavelength range between 719 nm and 940 nm. In the present disclosure, preferably, the overlapping portion of the wavelength ranges corresponding to the two adjacent light emission peak wavelengths of the light emitted by the two LEDs should be less. The wavelength ranges corresponding to the two adjacent light emission peak wavelengths of the light emitted by the two LEDs may not overlap, and the details of such embodiment will be explained later.

A difference between the two adjacent light emission peak wavelengths is larger than or equal to 1 nm, and preferably, 1-80 nm, and more preferably, 5-80 nm. In FIG. 2, a difference between the first light emission peak wavelength (734 nm) and the second light emission peak wavelength (810 nm) is 76 nm, and a difference between the second light emission peak wavelength (810 nm) and the third light emission peak wavelength (882 nm) is 72 nm. Unless otherwise specified, the limitation of the numerical range described in the scope of the present disclosure and the claims always comprises the end values, for example, the difference between the aforementioned two adjacent light emission peak wavelengths is between 5-80 nm, which means greater than or equal to 5 nm and less than or equal to 80 nm.

Figure 3:
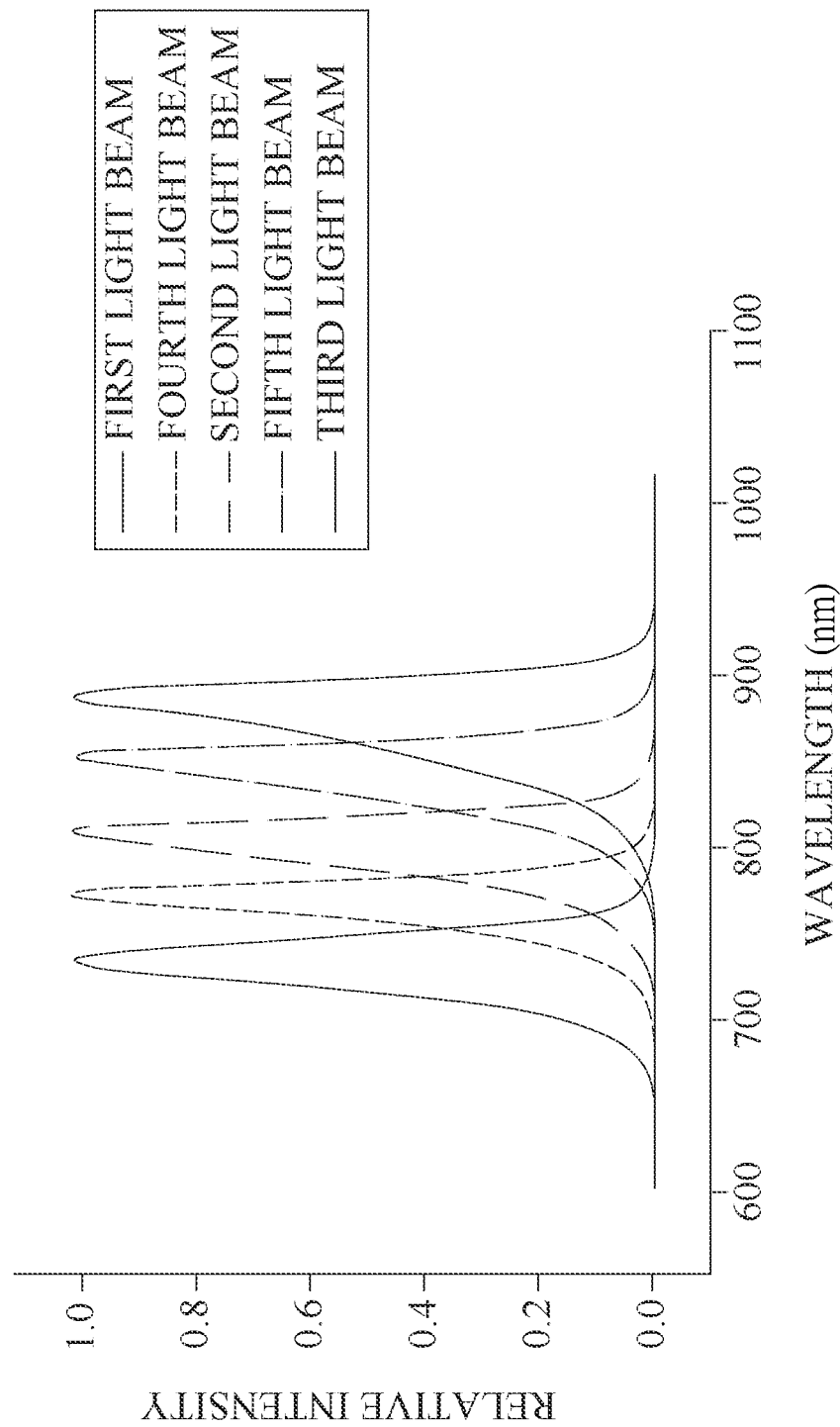
FIG. 3 is schematic diagram showing emission spectrums of LEDs according to a second embodiment of the present disclosure.

Refer to the second embodiment of FIG. 3, and the second embodiment is a derivative embodiment of the first embodiment, and therefore the similarities between the second embodiment and the first embodiment will not be repeated. The difference between the second embodiment and the first embodiment is that the light emitting apparatus 12 of the second embodiment comprises five LEDs. The five LEDs are respectively are the first LED 121, a fourth LED 1211 for emitting a fourth light beam with a fourth wavelength range, the second LED 122, a fifth LED 1221 for emitting a fifth light beam with a fifth wavelength range and the third LED 123. There is a fourth light emission peak wavelength (772 nm) within the fourth wavelength range, and there is a fifth light emission peak wavelength (854 nm) within the fifth wavelength range. In FIG. 3, from small to large, the light emission peak wavelengths are the first light emission peak wavelength (734 nm), the fourth light emission peak wavelength (772 nm), the second light emission peak wavelength (810 nm), the fifth light emission peak wavelength (854 nm) and the third light emission peak wavelength (882 nm). A difference between the first light emission peak wavelength (734 nm) and the fourth light emission peak wavelength (772 nm) is 38 nm, a difference between the fourth light emission peak wavelength (772 nm) and the second light emission peak wavelength (810 nm) is 38 nm, a difference between the second light emission peak wavelength (810 nm) and the fifth light emission peak wavelength (854 nm) is 44 nm, and a difference between the fifth light emission peak wavelength (854 nm) and the third light emission peak wavelength (882 nm) is 28 nm.

Figure 4:
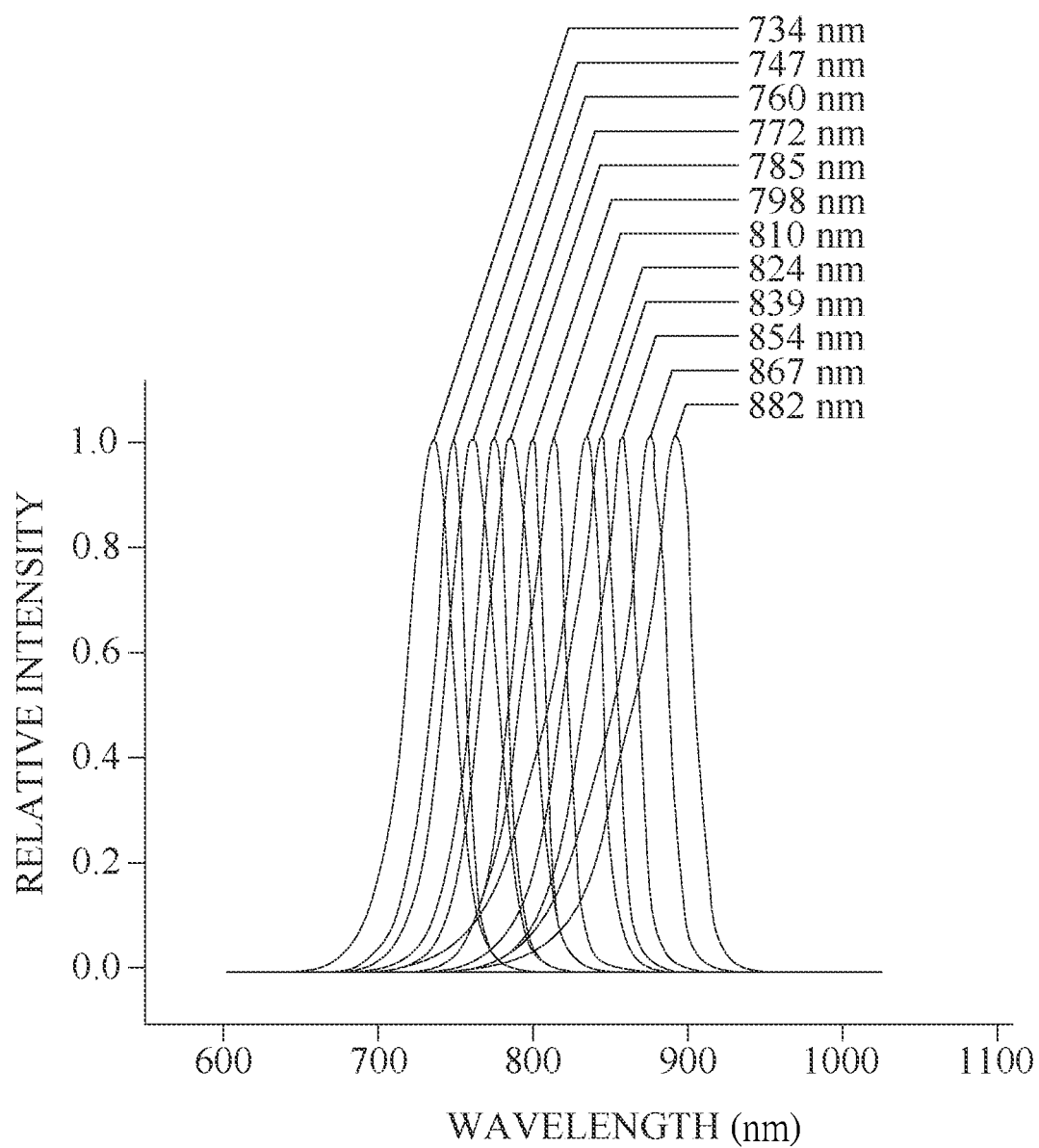
FIG. 4 is schematic diagram showing emission spectrums of LEDs according to a third embodiment of the present disclosure.

Refer to the third embodiment of FIG. 4, and the third embodiment is a derivative embodiment of the first embodiment and the second embodiment, and therefore the similarities among the second embodiment, the first embodiment and the second embodiment will not be repeated. The difference among the second embodiment, the first embodiment and the second embodiment is that the light emitting apparatus 12 of the second embodiment comprises twelve LEDs. In FIG. 4, from small to large, the light emission peak wavelengths corresponding to the twelve LEDs are respectively 734 nm (the first light emission peak wavelength), 747 nm, 760 nm, 772 nm (the fourth light emission peak wavelength), 785 nm, 798 nm, 810 nm (the second light emission peak wavelength), 824 nm, 839 nm, 854 nm (the fifth light emission peak wavelength), 867 nm and 882 nm (the third light emission peak wavelength). Among the twelve light emission peak wavelengths corresponding to the twelve LEDs, differences between each two adjacent light emission peak wavelengths are respectively 13 nm, 13 nm, 12 nm, 13 nm, 13 nm, 12 nm, 14 nm, 15 nm, 15 nm, 13 nm and 15 nm. If the light emitting units in the first to third embodiments are laser diodes (LDs), the difference between the two adjacent light emission peak wavelengths can be larger than or equal to 1 nm, for example, 1 nm.

A full-width at half-maximum (FWHM) corresponding to one of the at least partial light emission peak wavelengths is larger than 0 nm and less than or equal to 60 nm. Preferably, the FWHM corresponding to each of the light emission peak wavelengths is larger than 0 nm and less than or equal to 60 nm. For example, in the first to third embodiment, from small to large, the light emission peak wavelengths are respectively 734 nm (the first light emission peak wavelength), 747 nm, 760 nm, 772 nm (the fourth light emission peak wavelength), 785 nm, 798 nm, 810 nm (the second light emission peak wavelength), 824 nm, 839 nm, 854 nm (the fifth light emission peak wavelength), 867 nm and 882 nm (the third light emission peak wavelength). The FWHM corresponding to the first light emission peak wavelength of the first light beam, the FWHM corresponding to the second light emission peak wavelength of the second light beam, the FWHM corresponding to the third light emission peak wavelength of the third light beam, the FWHM corresponding to the fourth light emission peak wavelength of the fourth light beam and the FWHM corresponding to the fifth light emission peak wavelength of the fifth light beam are larger than 0 nm and less than or equal to 60 nm, preferably between 15 nm and 50 nm, and more preferably between 15 nm and 40 nm. The FWHMs corresponding to the light emission peak wavelengths of 747 nm, 760 nm, 785 nm, 798 nm, 824 nm, 839 nm and 867 nm shown in FIG. 4 are also are larger than 0 nm and less than or equal to 60 nm, preferably between 15 nm and 50 nm, and more preferably between 15 nm and 40 nm. During the experimental operation of the present disclosure, the FWHM corresponding to the light emission peak wavelength in one of the first to third embodiments is 55 nm. When the light emitting units are changed to be LDs, the FWHM corresponding to each of the light emission peak wavelengths is greater than 0 nm and less than or equal to 60 nm, for example, 1 nm.

The wavelength ranges corresponding to the aforementioned two adjacent light-emitting peak wavelengths of the two LEDs may not overlap. For example, in the aforementioned first embodiment, second embodiment and third embodiment, the FWHM corresponding to each light emission peak wavelength is 15 nm, and the width of the wavelength range corresponding to each light emission peak wavelength (that is, the difference between the maximum value and the minimum value of the wavelength range) is 40 nm, and a difference between the two adjacent light emission peak wavelengths is 80 nm. For another example, if the light emitting units are changed to be LDs, the FWHM corresponding to each light emission peak wavelength is 1 nm, the width of the wavelength range is 4 nm, the difference between the two adjacent light emission peak wavelengths is 5 nm, and the wavelength ranges corresponding to the two adjacent light emission peak wavelengths of the two light emitting units (LDs) do not overlap.

Figure 5A:
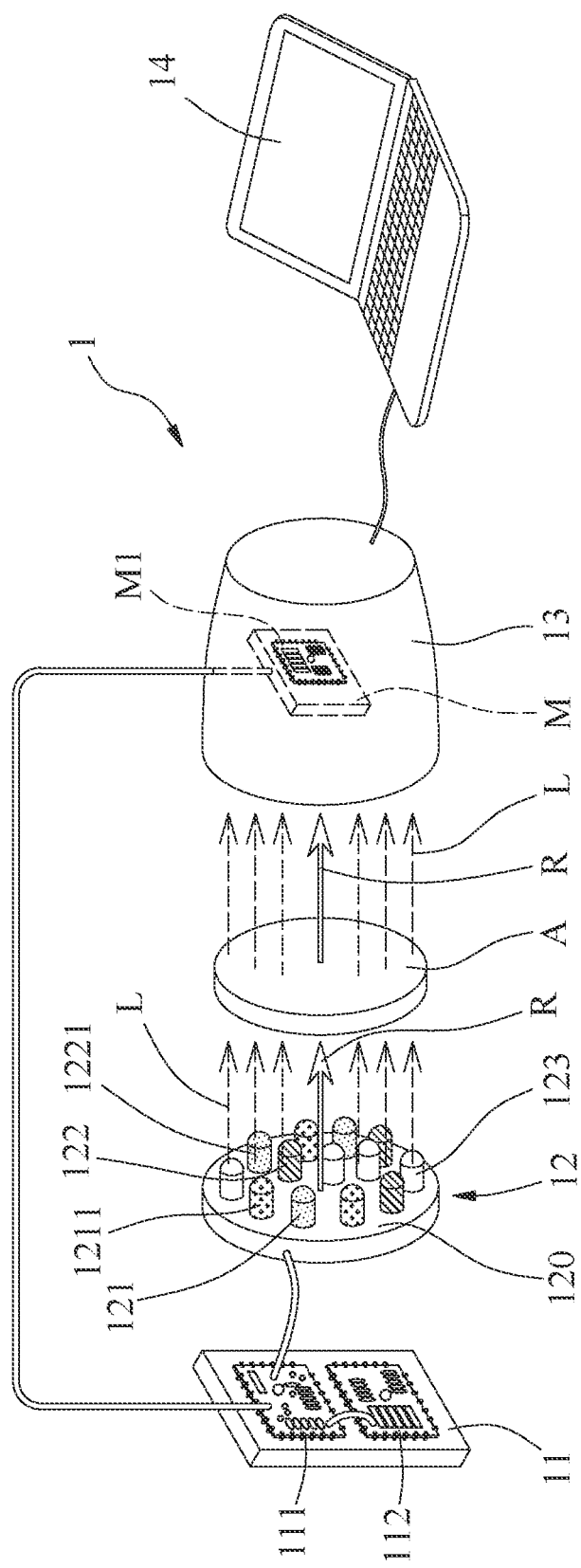
FIG. 5A is a second schematic diagram showing implementations of a light emitting apparatus and a light detection apparatus of the present disclosure.
Figure 5B:
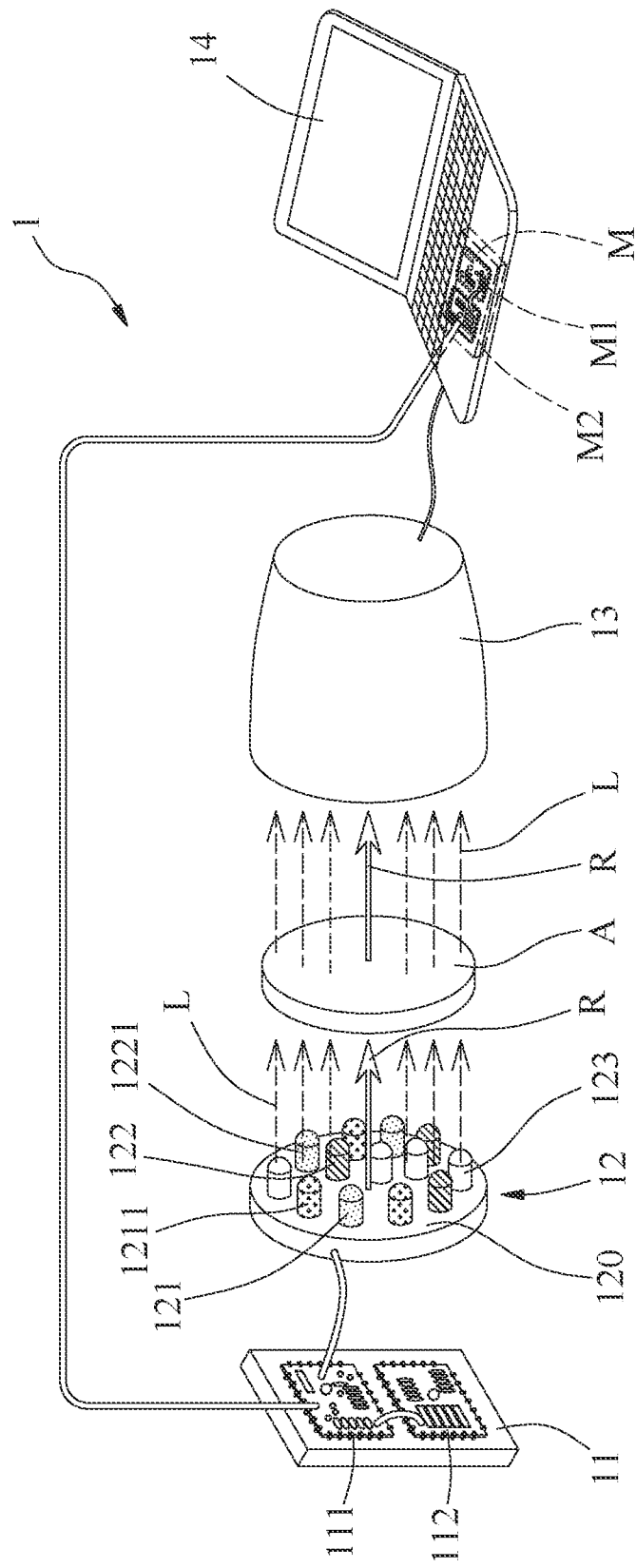
FIG. 5B is a second schematic diagram showing implementations of a light emitting apparatus and a light detection apparatus of the present disclosure.

Preferably, in the first through third embodiments, when operating the spectrometer (i.e. the light detection apparatus 1) to measure the object A under test to generate the spectrum of the object A under test, as mentioned above, the light source controller 11 controls the LEDs to discontinuously emit the light beams with the lighting frequencies. All of the lighting frequencies are identical to or different from each other, or partial of the lighting frequencies are identical to or different from each other. The lighting frequency is 0.05-50000 times/second, a light emitting unit turned-on time interval of the lighting frequency is 0.00001-10 seconds, and a light emitting unit turned-off time interval of the lighting frequency is 0.00001-10 seconds. A period of the lighting frequency means the sum of the time intervals for sequentially turning on (lighting) and turning off (extinguishing) the light emitting unit once. The period of the lighting frequency is the reciprocal of the lighting frequency. In other words, the period of the lighting frequency can be interpreted as the sum of the time interval which the LED is continuously turned on (i.e. a light emitting unit turned-on time interval of the lighting frequency) and the time interval which the LED is turned off without interruption after the LED is turned on (i.e. a light emitting unit turned-off time interval of the lighting frequency). The light emitting unit turned-on time interval of the lighting frequency is 0.00001-10 seconds, and the light emitting unit turned-off time interval of the lighting frequency is 0.00001-10 seconds. Preferably, the lighting frequency is 0.5-50000 times/second, and more preferably, the lighting frequency is 5-50000 times/second. Since the LEDs discontinuously emit the light beams, the effect of the thermal energy of the light beams emitted by the LEDs on the object A under test can be greatly reduced, and the qualitative change of the object A under test containing an organism can be avoided. The present disclosure is therefore particularly suitable for the object A under test that is sensitive to thermal energy, and more particularly suitable for the LED which emits the light with the wavelength range of the near infrared light. A mathematical analysis module M is installed in the light detector 13 (see FIG. 5A) or the computer 14 (see FIG. 5B), the mathematical analysis module M is electrically or signally connected to the light detector 13 (see FIG. 5A), or the mathematical analysis module M is electrically or signally connected to the computer 14 (see FIG. 5B), and the mathematical analysis module M can be a software or hardware based module. A signal collected by the light detector 1313 is transmitted to the mathematical analysis module M. When operating the spectrometer (i.e. the light detection apparatus 1) to measure the object A under test to generate the spectrum of the object A under test, the LEDs can be turned on or off at the same time with the same lighting frequencies. During the light emitting unit turned-on time interval of the lighting frequency, the signal received by the light detector 13 is a composite signal of a background noise and a spectrum signal of an object under test; and during the light emitting unit turned-off time interval of the lighting frequency, the signal received by the light detector 13 is the background noise. Refer to FIG. 6A, and the spectrometer (i.e. the light detection apparatus 1) is operated to make the LEDs discontinuously emits the light beams with the lighting frequencies to detect the object A under test, the spectrum signal of the object A under test and the background noise forms a time-domain signal of the object A under test. The time-domain signal of the object A under test formed by the spectrum signal of the object A under test and the background noise is received by the light detector 13, and transmitted to the mathematical analysis module M. The mathematical analysis module M can process the time-domain signal of the object A under test to filter out the background noise in the time-domain signal of the object A under test. For example, the mathematical analysis module M comprises a time-domain/frequency-domain transformation unit M1 (see FIG. 5A) for transforming the time-domain signal of the object A under test to a frequency-domain signal of the object A under test. The time-domain/frequency-domain transformation unit M1 is a Fourier transformation unit which performs a Fourier transformation on the time-domain signal of the object A under test to obtain the frequency-domain signal of the object A under test. After the Fourier transformation is performed, the frequency-domain signal of the object A under test can be seen in FIG. 6B. The frequency-domain signal of the object A under test can be easily divided into a frequency-domain signal of the spectrum signal of the object A under test and frequency-domain signal of the background noise. In FIG. 6B, the frequency-domain signal with the peak value at 0 Hz is less than frequency-domain signal at the lighting frequency, and the frequency-domain signal with the peak value at 0 Hz is the frequency-domain signal of the background noise. In FIG. 6B, the other frequency-domain signals with other peak values except for the frequency-domain signal with the peak value at 0 Hz (i.e. the frequency-domain signal of the background noise) form the frequency-signal of the spectrum signal of the object A under test. Preferably, in the frequency-domain signal of the object A under test, the frequency-domain signal being larger than or equal to the frequency-domain signal at the lighting frequency is the frequency-domain signal of the spectrum signal of the object A under test. The mathematical analysis module M filters out the frequency-domain signal of the background noise and reserves the frequency-domain signal of the spectrum signal of the object A under test, so as to achieve the filtering effect. Since the mathematical analysis module M discards the frequency-domain signal of the background noise, the reserved frequency-domain signal of the spectrum signal of the object A under test does not comprise the background noise. Thus, compared to the conventional spectrometer, the spectrometer (i.e. the light detection apparatus 1) of the present disclosure not only enhances the SNR of the spectrum of the object A under test, but also obtains the spectrum without background noise since the spectrometer (i.e. the light detection apparatus 1) of the present disclosure discards and filters out the frequency-domain signal of the background noise. Referring to FIG. 5A and FIG. 5B, the microcontroller unit 111 of the light source controller 11 is electrically or signally connected to the mathematical analysis module M, so as to transmit each lighting frequency, the light emitting unit (LED) turned-on time interval of each lighting frequency and the light emitting unit (LED) turned-off time interval of each lighting frequency to the mathematical analysis module M. Therefore, when the microcontroller unit 111 turns on or off the LEDs electrically connected to the microcontroller unit 111 according to the lighting frequencies, the light emitting unit (LED) turned-on time intervals of the lighting frequencies and the light emitting unit (LED) turned-off time intervals of the lighting frequencies, the mathematical analysis module M can correspond the light emitting unit (LED) turned-on time intervals of the lighting frequencies to the spectrum signal of the object A under test, and correspond the light emitting unit (LED) turned-off time intervals of the lighting frequencies to the background noise.

It is particularly noted that the waveforms of the discontinuous light emitted by the LEDs with the lighting frequencies are square waves, sine waves or negative sine waves, and the present disclosure is not limited thereto.

In addition, the mathematical analysis module M can process the reserved frequency-domain signal of the spectrum signal of the object A under test after filtering out the frequency-domain signal of the object A under test, and transform the frequency-domain signal of the spectrum signal of the object A under test to obtain a filtered time-domain signal of the object A under test. The filtered time-domain signal of the object A under test merely has the filtered spectrum signal of the object A under test without background noise. For example, the mathematical analysis module M comprises a frequency-domain/time-domain transformation unit M2 (see FIG. 5B) for transforming the reserved frequency-domain signal of the spectrum signal of the object A under test to the filtered time-domain signal of the object A under test. The frequency-domain/time-domain transformation unit M2 can be an inverse Fourier transformation unit which performs an inverse Fourier transformation on the reserved frequency-domain signal of the spectrum signal of the object A under test to obtain the filtered time-domain signal of the object A under test. The filtered time-domain signal of the object A under test which is transformed from the reserved frequency-domain signal of the spectrum signal of the object A under test can be seen in FIG. 6C. Comparing FIG. 6A with FIG. 6C, it is obvious to see that the filtered time-domain signal of the object A under test in FIG. 6C is the filtered spectrum signal of the object A under test, and the filtered spectrum signal of the object A under test have a square waveform. The filtered time-domain signal of the object A under test does not have the background noise. In other words, the background noise in FIG. 6C is zero, and if dividing the filtered spectrum signal of the object A under test over the background noise, the obtained SNR is infinite. Therefore, the present disclosure enhance the SNR of the spectrum of the test results of the sample (the object A under test), and the high test accuracy can be achieved. It is noted that, the mathematical analysis module M, the time-domain/frequency-domain transformation unit M1 and the frequency-domain/time-domain transformation unit M2 can be implemented by the hardware and/or the software. The mathematical analysis module M, the time-domain/frequency-domain transformation unit M1 and the frequency-domain/time-domain transformation unit M2 are electrically or signally connected to each other.

[Wavelength Resolution Test of Comparative and Application Examples]

In the comparative example 1, the conventional spectrometer having the model number of SE-2020-050-VNIR made by Oto photonics is used to measure the reflection spectrum signal of the objects under test. The conventional spectrometer uses the tungsten halogen lamp as the light source and has a 1 nm wavelength resolution by using the grating. The objects under test are PVC (Polyvinyl Chloride) plates, a surface of one of the PVC plates is coated with zinc oxide, and a surface of the other one of the PVC plates is coated with mixture of zinc oxide and iron oxide. Each of the PVC plates has a thickness being 2 cm, a length being 5 cm and a width being 5 cm. The obtained spectrum image data are processed and analyzed by a similarity (difference) process technology, i.e. SAM (Spectral Angle Match or Spectral Angle Mapping) process and analysis technology, so as to perform the similarity analysis for the zinc oxide and the mixture of the zinc oxide and iron oxide. The SAM analysis result is 96.00% (see FIG. 7A).

Application examples 1-3 correspond to the light emitting apparatuses and light detection apparatuses of the first through third embodiments, the lighting frequency is 90.90 times/second, the light emitting unit (LED) turned-on time interval of the lighting frequency is 10 ms, the light emitting unit (LED) turned-off time interval of the lighting frequency is 10 ms, and the light detector is the light detector of SE-2020-050-VNIR made by Oto photonics. The application examples 1-3 are used to measure the reflection spectrum signal of the objects under test. The objects under test are PVC (Polyvinyl Chloride) plates, a surface of one of the PVC plates is coated with zinc oxide, and a surface of the other one of the PVC plates is coated with mixture of zinc oxide and iron oxide. Each of the PVC plates has a thickness being 2 cm, a length being 5 cm and a width being 5 cm. The obtained spectrum image data are processed and analyzed by a similarity (difference) process technology, i.e. SAM (Spectral Angle Match or Spectral Angle Mapping) process and analysis technology, so as to perform the similarity analysis for the zinc oxide and the mixture of the zinc oxide and iron oxide. The SAM analysis results are respectively 97.69% (FIG. 7B), 97.48% (FIG. 7C) and 96.54% (FIG. 7D), and all of them are close to the analysis result of 96.00% by using the conventional spectrometer of the comparative example 1. Thus, wavelength resolution characteristics of the light emitting apparatuses and the light detection apparatuses in the first to third embodiments are close to that of the conventional spectrometer the comparative example 1. Thus, the wavelength resolution characteristics of the light emitting apparatuses and the spectrometers of the application examples 1-3 (i.e. the first through third embodiments) can replace wavelength resolution characteristics of the conventional spectrometer.

Thus, according to the light emitting apparatus 12 and light detection apparatus 1, FIG. 8 shows a flow chart of a light emitting method which comprises a light emitting unit providing step S01 and a light emitting step S02.

In the light emitting unit providing step S01, a plurality of light emitting units are provided, each of the light emitting units emits light with at least a light emission peak wavelength and at least a wavelength range, and the wavelength ranges of the two light emitting units corresponding to the two adjacent light emission peak wavelengths are partially overlapped to form a continuous wavelength range which is wider than each of the wavelength ranges of the light emitting units, or alternatively, the wavelength ranges of the two light emitting units corresponding to the two adjacent light emission peak wavelengths are non-overlapped; wherein a difference between the two adjacent light emission peak wavelengths is larger than or equal to 1 nm, a full-width at half-maximum (FWHM) corresponding to one of the at least partial light emission peak wavelengths is larger than 0 nm and less than or equal to 60 nm. The light emitting unit can be a light emitting diode (LED), a vertical-cavity surface-emitting laser (VCSEL) or a laser diode (LD). Preferably, the difference between the two adjacent light emission peak wavelengths is 1-80 nm, and more preferably, the difference between the two adjacent light emission peak wavelengths is 5-80 nm. Preferably, the FWHM corresponding to each of the light emission peak wavelengths is 15-50 nm, and more preferably, the FWHM corresponding to each of the light emission peak wavelength is 15-40 nm.

In the light emitting step S02, each of the light emitting units is controlled to discontinuously emit the light with a lighting frequency, and all of the lighting frequencies are identical to or different from each other, or partial of the lighting frequencies are identical to or different from each other. The lighting frequency is 0.05-50000 times/second, a light emitting unit turned-on time interval of the lighting frequency is 0.00001-10 seconds, and a light emitting unit turned-off time interval of the lighting frequency is 0.00001-10 seconds. Preferably, the lighting frequency is 0.5-50000 times/second, and more preferably, the lighting frequency is 5-50000 times/second.

According to the descriptions of the light emitting apparatus 12, the light detection apparatus 1, and the light emitting method, FIG. 9 provides a spectrum detection method. The spectrum detection method comprises the light emitting unit providing step S01 and the light emitting step S02 which is executed after the light emitting unit providing step S01 is executed. The spectrum detection method further comprises a filtering step S03 and an inverse transformation performing step S04, wherein the filtering step S03 is executed after the light emitting step S02 is executed, and the inverse transformation performing step S04 is executed after the filtering step S03 is executed.

In the filtering step S03, a spectrum signal of an object under test and a background noise are received during a light emitting unit turned-on time interval of the lighting frequency, wherein a received signal is a composite signal of a background noise and a spectrum signal of an object under test, the received signal during a light emitting unit turned-off time interval of the lighting frequency is the background noise, and the spectrum signal of the object under test and the background noise forms a time-domain signal of the object under test; then, a Fourier transformation is performed on the time-domain signal of the object under test to obtain a frequency-domain signal of the object under test, wherein the frequency-domain signal of the object under test comprises a frequency-domain signal of the spectrum signal of the object under test and a frequency-domain signal of the background noise; and next, the frequency-domain signal of the background noise is filtered out and the frequency-domain signal of the spectrum signal of the object under test is reserved to achieve the filtering effect.

In the inverse transformation performing step S04, an inverse Fourier transformation is performed on the reserved frequency-domain signal of the spectrum signal of the object under test to obtain the filtered time-domain signal of the object under test.

[SNR Test]

Application example 4 corresponds to the light emitting apparatus and the light detection apparatus of the third embodiment, the lighting frequency is 100 times/second, the light emitting unit (LED) turned-on time interval of the lighting frequency is 5 ms, the light emitting unit (LED) turned-off time interval of the lighting frequency is 5 ms, and the light detector is the light detector of SE-2020-050-VNIR made by Oto photonics. The application example 4 is used to measure the reflection spectrum signal of the objects under test. The objects under test are PVC (Polyvinyl Chloride) plates, a surface of one of the PVC plates is coated with zinc oxide, and a surface of the other one of the PVC plates is coated with mixture of zinc oxide and iron oxide. Each of the PVC plates has a thickness being 2 cm, a length being 5 cm and a width being 5 cm. The time-domain signal of the object under test formed by the spectrum signal of the object under test and the background noise is shown in FIG. 6A. The waveform of the light discontinuously emitted by the LEDs with the lighting frequencies is a square wave. Next, in the filtering step S03, the time-domain signal of the object under test is performed with a Fourier transformation to obtain the frequency-domain signal of the object under test as shown in FIG. 6B, wherein the frequency-domain signal of the object under test can be divided into the frequency-domain signal of the spectrum signal of the object under test can and the frequency-domain signal of background noise. For example, when the period of the lighting frequency is 10 ms, and the lighting frequency is 100 Hz, the frequency-domain signal at the frequency larger or equal to 100 Hz is the frequency-domain signal of the spectrum signal of the object under test, and the frequency-domain signal with the peak value at 0 Hz is the frequency-domain signal of the background noise. The filtering step S03 filters out the frequency-domain signal of the background noise, and reserves the frequency-domain signal of the spectrum signal of the object under test. Next, in the inverse transformation performing step S04, the reserved frequency-domain signal of the spectrum signal of the object under test is performed with an inverse Fourier transformation to obtain filtered time-domain signal of the object under test (see the discontinuous square wave in FIG. 6C). It is obvious that the background noise does not exist in FIG. 6C (i.e. the signal of the background noise is zero), and the obtained SNR is infinite, which can achieve effect of the accurate measurement.

The light emitting units are respectively provided with current densities, so that the light beam emitted by each of the light emitting unit has a light intensity. All of the current densities are different from or identical to each other, or partial of the current densities are different from or identical to each other, or all of the light intensities are different from or identical to each other, or partial of the light intensities are different from or identical to each other. Preferably, all of the current densities are different from each other, or partial of the current densities are different from each other. Another manner for increasing SNR can be seen in FIG. 10A, the light source controller 11 further comprises a current controller 113 electrically connected to the microcontroller 111, each current density is generated by the current controller 113, and then a signal of each current density is transmitted to the microcontroller 111. Next, the microcontroller 111 provides the corresponding current densities to the LEDs electrically connected to the microcontroller 111 according to the signals of the current densities, for example, the current densities are respectively provided to the first LED 121, the second LED 122, the third LED 123, the fourth LED 1211 and the fifth LED 1221. For other example, a first current density is provided to the first LED 121, and the first light beam emitted by the first LED 121 has a first light intensity; a second current density is provided to the second LED 122, and the second light beam emitted by the second LED 122 has a second light intensity; a second current density is provided to second first LED 123, and the third light beam emitted by the third LED 123 has a third light intensity; a fourth current density is provided to the fourth LED 124, and the fourth light beam emitted by the fourth LED 124 has a fourth light intensity; and a fifth current density is provided to the fifth LED 125, and the fifth light beam emitted by the fifth LED 125 has a fifth light intensity. In particular, the current controller 113 can also be a current density module integrated in the microcontroller 111 to generate the current density, and the current density module can be a software or hardware based module, so it is not necessary to additionally set the current controller 113 outside the microcontroller 111.

During actual operation, another kind of the light emitting method can be used to carry out, and the light emitting method, except comprising the aforementioned light emitting unit providing step S01 and the light emitting step S02 executed in sequence, also comprises an initial spectrum energy distribution curve obtaining step S021 and a current density adjusting step S022, wherein the initial spectrum energy distribution curve obtaining step S021 is executed after the light emitting step S02 is executed, and the current density adjusting step S022 is executed after the initial spectrum energy distribution curve obtaining step S021 is obtained. The aforementioned spectrum detection method can be changed to comprise the filtering step S03 and the inverse transformation performing step S04 executed in sequence after the current density adjusting step S022 is executed, as shown in FIG. 10B.

In the initial spectrum energy distribution curve obtaining step S021, the same current densities are respectively provided to the LEDs, under the condition that the object under test does not exist in FIG. 10A, the initial spectrum energy distribution curve of the light emitting apparatus 12 measured and obtained by using the light detector 13 and the computer 14 is shown in FIG. 10C. In FIG. 10C, it shows the first wavelength range corresponding to the first light emission peak wavelength (734 nm) of the first light beam, and the corresponding first light intensity is $6.8 \times 10^6$ (a.u.), and it also shows the fourth wavelength range corresponding to the fourth light emission peak wavelength (772 nm) of the fourth light beam, and the corresponding fourth light intensity is $17.7 \times 10^7$ (au). Since the background noise is a fixed value and the fourth light intensity is greater than the first light intensity, it is obvious that the SNR of the fourth wavelength range is higher than the SNR of the first wavelength range.

In the current density adjusting step S022, the LED corresponding to the light intensity of a specific value among the light intensities is selected, and usually, the LED corresponding to the light intensity of a maximum value among the light intensities is selected, for example, in FIG. 10C, the fourth LED 1211 corresponding to the fourth light intensity is selected. Still in the current density adjusting step S022, the current density corresponding to the non-selected LED is increased or decreased, so to make the light intensity corresponding to the non-selected LED similar or approximate to the light intensity corresponding to the selected LED. For example, in FIG. 10C, the non-selected LED is the first LED 121, and the first current density of the first LED 121 is increased, so as to make the first light intensity corresponding to the non-selected first LED 121 similar or approximate to the fourth light intensity corresponding to the selected fourth LED 1211, and the e the first light intensity and the fourth light intensity are equal or approximate to $17.7 \times 10^7$ (a.u.). Thus, the SNR of the first wavelength range is increased, and the spectrum energy distribution curve after the first current density is adjusted can be seen in FIG. 10D. Of course, the current densities corresponding to the non-selected LEDs are increased or decreased, so to make the light intensities corresponding to the non-selected LEDs similar or approximate to the light intensity corresponding to the selected LED. For example, the current densities corresponding to the non-selected LEDs in FIG. 10C can be adjusted, so that the light intensities corresponding to the non-selected LEDs and the fourth light intensity corresponding to the selected fourth LED 1211 are equal or approximate to $17.7 \times 10^7$ (a.u.). Thus, the SNRs of the wavelength ranges corresponding to the non-selected LEDs are increased, and the SNRs of the wavelength ranges corresponding to all of the LEDs are similar to each other. The spectrum energy distribution curves after the current densities of the non-selected LEDs are adjusted can be seen in FIG. 10E.

Since the light intensity of each LED is inversely related to its junction temperature, and the heat dissipation problem of the LED exists, when the continuous operation time of the LED under the current density increases, the junction temperature is increase to cause the light intensity to decrease, so it is necessary to correct the light intensity by using a lighting correction method. The lighting correction method comprises steps executed sequentially, and the steps are respectively are a correction relation obtaining step P01, a forward bias measuring step P02, a ratio relation obtaining step P03 and a correction completing step P04. The lighting correction method can be executed after the light emitting method is executed, and the filtering step S03 and the inverse transformation performing step S04 in the spectrum detection method can be executed after the lighting correction method is executed. The flowchart of the lighting correction method, the light emitting method and the spectrum detection method can be seen in FIG. 11A.

In the correction relation obtaining step P01, a mathematical relation or a relation table or graph having relationship of the light intensity or the relative intensity of each of the LEDs and a junction temperature is obtained, and usually, the mathematical relation or the relation table or graph having relationship of the light intensity or the relative intensity of each of the LEDs and the junction temperature can be provided by the manufacturer of the LED. See FIG. 11B, and FIG. 11B is a schematic diagram showing the relation of the relative intensity and the junction temperature of the fourth LED 1211 of the present disclosure. The fourth light emission peak wavelength of the fourth LED 1211 at the junction temperature of 25 degrees Celsius is 772 nm and the relative intensity is calculated as 100%. In addition, a mathematical relation or a relation table or graph having relationship of a forward bias of each of the LEDs and the junction temperature is also obtained, and the fourth light emission peak wavelength and the forward bias of the fourth LED 1211 at the junction temperature of 25 degrees Celsius are respectively 772 nm and 2 volts. See FIG. 11C, and FIG. 11C is a schematic diagram showing relation of the forward bias and the junction temperature of the fourth LED 1211 of the present disclosure. It is noted how to obtain the mathematical relation or the relation table or graph having relationship of the light intensity or the relative intensity of each of the LEDs and the junction temperature and to how to obtain the mathematical relation or the relation table or graph having relationship of the forward bias of each of the LEDs and the junction temperature can be referred to TW patent publication TW 200818363, and the details are thus omitted.

In the forward bias measuring step P02, during a LED turned-on time interval, such as the LED turned-on time interval of the lighting frequency, the forward bias of the LED is measured. As mentioned in the second and third embodiments, the lighting frequency of the fourth LED 1211 is 90.90 times/second, the LED turned-on time interval of the lighting frequency is 1 ms, and the LED turned-off time interval of the lighting frequency is 10 ms. During the LED turned-on time interval of the lighting frequency corresponding to the fourth LED 1211, the forward bias of the fourth LED 1211 is measured at the same time, and the measured forward bias of the fourth LED 1211 is 1.9 volts.

In the ratio relation obtaining step P03, based on the obtained mathematical relation or the relation table or graph having relationship of the forward bias of each of the LEDs and the junction temperature, the measured forward bias is mapped to calculate the junction temperature. For example, as shown in FIG. 11C, if the measured forward bias of the fourth LED 1211 is 1.9 volts, the junction temperature will be 50 degrees Celsius. Next, based on the obtained mathematical relation or the relation table or graph having relationship of the light intensity or the relative intensity of each of the LEDs and the junction temperature, the calculated junction temperature us mapped to calculate the light intensity or the relative intensity. For example, as shown in FIG. 11B, if the junction temperature is 50 degrees Celsius, the relative intensity of the fourth LED 1211 will be 83%. Next, the calculated light intensity or the calculated relative intensity and a light intensity or a relative intensity corresponding to a specific junction temperature are compared to obtain a ratio relation, wherein the light intensity or the relative intensity corresponding to the specific junction temperature is obtained from the mathematical relation or the relation table or graph having relationship of the light intensity or the relative intensity of each of the LEDs and a junction temperature. For example, if the specific junction temperature is 25 degrees Celsius, the relative intensity of the fourth LED 1211 at 25 degrees Celsius will be 100%. The relative intensity at 25 degrees Celsius (100%) is divided by the relative intensity at 50 degrees Celsius (83%) to obtain the ratio relation being 1.20 times.

In the correction completing step P04, the light intensity of the wavelength range corresponding to the LED in the initial spectrum energy distribution curve is multiplied by the ratio relation to achieve correction of the light intensity; or alternatively, a measured spectrum signal of the wavelength range corresponding to the LED is multiplied by the ratio relation to achieve correction of the spectrum signal. The spectrum signal of the wavelength range can be the time-domain signal of the object under test formed by the spectrum signal of the object under test and the background noise. For example, the light detector 13 or the computer 14 multiplies the fourth intensity of $17.7 \times 10^7$ (a.u.) corresponding to the fourth LED 1211 by the ratio relation of 1.20 time to obtain the corrected light intensity. The corrected light intensity can be regarded as the light intensity of the fourth LED 1211 at the specific junction temperature (25 degrees Celsius).

In particular, the present disclosure is to execute the lighting correction method sequentially or simultaneously to at least one of the LEDs, partial of the LEDs, or all of the LEDs in the light emitting apparatus 12. Preferably, the present disclosure performs the lighting correction method for all the LEDs at the same time, and the corrected spectrum energy distribution curve obtained in this way can be regarded as the spectrum energy distribution curve at the specific junction temperature (25 degrees Celsius), and the corrected spectrum signal can be regarded as the spectrum signal the specific junction temperature (25 degrees Celsius).

For the precise measurement of surface composition or internal composition of the whole object A under test, please refer to FIG. 12A and FIG. 12B together, and the light emitting apparatus 12 of the light detection apparatus 1 can rotate relative to the object A under test. Refer to FIG. 12A, the light emitting apparatus 12 is connected to a rotating device 15, and the rotating device 15 drives the light emitting units to revolve around the revolving axis. Thus, the light emitting apparatus 12 rotates relative to the object A under test, and the revolving axis can be a physical revolving axis or a virtual revolving axis. In other words, the light emitting apparatus 12 is capable of rotation. For example, the rotating device 15 may be a motor electrically connected to the microcontroller 111, the rotating device 15 drives a rotating shaft 151 to rotate, and one end of the rotating shaft 151 is connected to the circuit board 120 of the light emitting apparatus 12, so the rotating shaft 151 can be regarded as the revolving axis. At least partial of the light emitting units are not in the extending direction of the revolving axis, so the light emitting units that are not in the extending direction of the revolving axis revolve around the revolving axis. A plurality of regions of the object A under test may have slightly different components, and for example, a first region A1 and a second region A2 of the object A under test have slightly different components. When the first LED 121 and the first region A1 form a first relative position (FIG. 12A), that is to say, the light emitting apparatus 12 and the object A under test form the first relative position, and the first LED 121 is relatively close to the first region A1 and farther away from the second region A2, the first light beam with the first wavelength range emitted by the first LED 121 penetrates the first region A1 and the second region A2 and is received by the light detector 13. The light detector 13 converts the received first light beam into a spectrum signal of the object A under test of the first relative position, and transmits the spectrum signal of the object A under test of the first relative position to the computer 14. Referring to FIG. 12B, when the first LED 121 revolves around the revolving axis to form a second relative position with the first region A1, that is to say, the light emitting apparatus 12 and the object A under test form the second relative position, and the first LED 121 is closer to the second region A2 and farther away from the first region A1, the first light beam with the first wavelength range emitted by the first LED 121 penetrates the first region A1 and the second region A2 and is received by the light detector 13. The light detector 13 converts the received first light beam into a spectrum signal of the object A under test of the second relative position, and transmits the spectrum signal of the object A under test of the second relative position to the computer 14. The computer 14 performs an averaging calculation on the spectrum signal of the object A under test of the first relative position and the spectrum signal of the object A under test of the second relative position, so as to obtain the above mentioned spectrum signal of the object A under test. Similarly, the second LED 122 also revolves around the revolving axis from the first relative position to the second relative position. In this way, there will be no problem of distortion of the spectrum signal of the object A under test due to the existence of slightly different components in the plurality of regions of the object A under test.

When the light emitting apparatus 12 and the object A under test form the first relative position, as mentioned above, the LEDs can be turned on or off a simultaneously according to actual demand, or only one or partial of the LEDs can be turned on or off, or the LEDs can be turned on or off in sequence, or the LEDs can be turned on or off according to the lighting frequencies, and the light detector 13 converts the received light beam L into a spectrum signal of the object A under test of the first relative position, and transmits the spectrum signal of the object A under test of the first relative position to the computer 14. Next, when the light emitting apparatus 12 and the object A under test form the second relative position, in the similar manner, the LEDs can be turned on or off a simultaneously according to actual demand, or only one or partial of the LEDs can be turned on or off, or the LEDs can be turned on or off in sequence, or the LEDs can be turned on or off according to the lighting frequencies, and the light detector 13 converts the received light beam L into a spectrum signal of the object A under test of the second relative position, and transmits the spectrum signal of the object A under test of the second relative position to the computer 14. The computer 14 performs an averaging calculation on the spectrum signal of the object A under test of the first relative position and the spectrum signal of the object A under test of the second relative position, so as to obtain the above mentioned spectrum signal of the object A under test.

In order to measure the object A under test more accurately, therefore during practical use, this light emitting apparatus 12 and the object A under test can form multiple relative positions. When each of the relative positions is formed, the LEDs can be turned on or off a simultaneously according to actual demand, or only one or partial of the LEDs can be turned on or off, or the LEDs can be turned on or off in sequence, or the LEDs can be turned on or off according to the lighting frequencies, and the light detector 13 converts the received light beam L into a spectrum signal of the object A under test of the relative position, and transmits the spectrum signal of the object A under test of the relative position to the computer 14. The computer 14 performs an averaging calculation on the spectrum signals of the object A under test of the relative positions, so as to obtain the above mentioned spectrum signal of the object A under test. For example, the microcontroller 111 controls the rotation of the rotating shaft 151 of the rotating device 15, so that the plurality of the light emitting units of the light emitting apparatus 12 rotate by a predetermined angle around the revolving axis, for example, every 10 degrees of rotation forms a relative position, so there are a total of 36 relative positions in the entire 360-degree revolution. The computer 14 performs an averaging calculation on the 36 spectrum signals of the object A under test of the 36 relative positions, so as to obtain the above mentioned spectrum signal of the object A under test.

In the similar manner, refer to FIG. 12C, in other implementations, the object A under test is connected to the rotating device 15. The rotating device 15 drives the object A under test to rotate around a spin axis A0, thereby causing the light emitting apparatus 12 to rotate relative to the object A under test. The spin axis A0 can be a physical spin axis or a virtual spin axis. In FIG. 12C, the rotating device 15 drives the rotating shaft 151 to rotate, the rotating shaft 151 drives the object A under test to rotate by means of gears, and the normal to the center of the object A under test is the virtual spin axis, that is, the spin axis A0. Similarly, for example, the microcontroller 111 controls the rotation of the rotating device 15, so that when the object A under test spins every 10 degrees along the spin axis A0, a relative position is formed. Thus, there are a total of 36 relative positions in the entire 360-degree spin rotation. The computer 14 performs an averaging calculation on the 36 spectrum signals of the object A under test of the 36 relative positions, so as to obtain the above mentioned spectrum signal of the object A under test.

Even the regions of the object A under test have the same composition, if the surface of the object A under test cannot be kept parallel to the light emitting apparatus 12, the distance between the first LED 121 and the object A under test and the distance between the second LED 122 and the object A under test will be different. Thus, the spectrum signal of the object A under test generated by the first light beam of the first LED 121 and the second light beam of the second LED 122 may be distorted. Referring to FIG. 12D, the light emitting apparatus 12 of the present disclosure can rotate relative to the object A under test, the light emitting apparatus 12 and the object A under test can form a plurality of relative positions, and the light detector 13 converts the received light beam L into a spectrum signal of the object A under test of each of the relative positions, and transmits the spectrum signal of the object A under test of each of the relative positions to the computer 14. The computer 14 performs an averaging calculation on the spectrum signals of the object A under test of the relative positions, so as to obtain the above mentioned spectrum signal of the object A under test. In this way, the problem that the spectrum signal of the object under test is distorted due to the different distances of the light emitting units of the light emitting apparatus 12 and the object A under test can be solved.

Similarly, referring to FIG. 12E, the light emitting apparatus 12 and the light detector 13 are arranged on the same side of the object A under test, for example, the light emitting apparatus 12 and the light detector 13 are arranged on the upper side of the object A under test to measure the reflection spectrum signal of the object A under test. The distance between the first LED 121 and the object A under test and the distance between the second LED 122 and the object A under test will be different. Thus, the spectrum signal of the object A under test generated by the first light beam of the first LED 121 and the second light beam of the second LED 122 may be distorted. The light emitting apparatus 12 of the present disclosure can rotate relative to the object A under test. For example, two rotating devices 15 are provided, so that a plurality of the light emitting units revolve around the revolving axis (the rotating shaft 151), and the object A under test rotates around the spin axis A0. The light emitting apparatus 12 and the object A under test can form a plurality of relative positions, and the light detector 13 converts the received light beam L into a spectrum signal of the object A under test of each of the relative positions, and transmits the spectrum signal of the object A under test of each of the relative positions to the computer 14. The computer 14 performs an averaging calculation on the spectrum signals of the object A under test of the relative positions, so as to obtain the above mentioned spectrum signal of the object A under test. In this way, the problem that the spectrum signal of the object under test is distorted due to the different distances of the light emitting units of the light emitting apparatus 12 and the object A under test can be solved.

As can be seen from the above description, compared with the prior art and current marked product, the light emitting apparatus, the light emitting method, the light detection apparatus, the spectrum detection method and the lighting correction method provided by the present disclosure have the analysis result of the sample close to the high resolution result of the conventional halogen tungsten lamp spectrometer, and at the same time, the signal-to-noise ratio in the spectrum of the sample detection result is improved, which can indeed achieve the effect of accurate testing.

To sum up, the light emitting apparatus, the light emitting method, the light detection apparatus, the spectrum detection method and the lighting correction method of the present disclosure can achieve the dedicated effect and are not disclosed by the prior art before the present disclosure is submitted. That is, the present disclosure has patentability, and allowance of the present disclosure is respectfully requested by the Applicant.

The above-mentioned embodiments only exemplarily illustrate the principle and efficacy of the present disclosure, and are not intended to limit the present disclosure. Anyone who is familiar with this technology can modify or change the above embodiments without violating the spirit and scope of the present disclosure. Therefore, all equivalent modifications or changes made by those with ordinary knowledge in the technical field without departing from the spirit and technical ideas disclosed in this present disclosure should still be fall within the claim scope of the present disclosure.

The invention claimed is:

1. A lighting correction method, comprising steps sequentially executed as follows:
   a correction relation obtaining step: providing a plurality of light emitting units, wherein each of the light emitting units emits light with at least a light emission peak wavelength and at least a wavelength range, and the light emitted by each of the light emitting unit has a light intensity;
   and then, obtaining a mathematical relation or a relation table or graph having relationship of the light intensity or the relative intensity of each of the light emitting units and a junction temperature, and also obtaining a mathematical relation or a relation table or graph having relationship of a forward bias of each of the light emitting units and the junction temperature;
   a forward bias measuring step: during a light emitting unit turned-on time interval, measuring the forward bias of the light emitting unit;
   a ratio relation obtaining step: mapping the measured forward bias based on the obtained mathematical relation or the relation table or graph having relationship of the forward bias of each of the light emitting units and the junction temperature to calculate the junction temperature;
   next, mapping the calculated junction temperature based on the obtained mathematical relation or the relation table or graph having relationship of the light intensity or the relative intensity of each of the light emitting units and a junction temperature to calculate the light intensity or the relative intensity; and next, comparing the calculated light intensity or the calculated relative intensity and a light intensity or a relative intensity corresponding to a specific junction temperature to obtain a ratio relation, wherein the light intensity or the relative intensity corresponding to the specific junction temperature is obtained from the mathematical relation or the relation table or graph having relationship of the light intensity or the relative intensity of each of the light emitting units and a junction temperature; and
   a correction completing step: multiplying the light intensity of the wavelength range corresponding to the light emitting unit in the initial spectrum energy distribution curve by the ratio relation to achieve correction of the light intensity; or multiplying a measured spectrum signal of the wavelength range corresponding to the light emitting unit by the ratio relation to achieve correction of the spectrum signal.

* * * * *